(12) United States Patent
Mindock et al.

(10) Patent No.: US 11,225,339 B2
(45) Date of Patent: Jan. 18, 2022

(54) SYSTEM AND METHOD FOR SHAPE MEMORY ALLOY THERMAL INTERFACE

(71) Applicant: THE BOEING COMPANY, Chicago, IL (US)

(72) Inventors: Eric S. Mindock, Playa del Rey, CA (US); James H. Mabe, Kirkwood, MO (US); Frederick Theodore Calkins, Renton, WA (US); Abraham Naroll Gissen, Brentwood, MO (US); Miguel A. Estevez, Westchester, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/913,855

(22) Filed: Jun. 26, 2020

(65) Prior Publication Data

US 2020/0331639 A1   Oct. 22, 2020

Related U.S. Application Data

(63) Continuation of application No. 15/494,315, filed on Apr. 21, 2017, now Pat. No. 10,730,645.

(51) Int. Cl.
| | |
|---|---|
| *H05K 7/20* | (2006.01) |
| *B64G 1/50* | (2006.01) |
| *F28D 21/00* | (2006.01) |
| *H01L 23/427* | (2006.01) |
| *H01L 23/42* | (2006.01) |
| *F28F 13/00* | (2006.01) |
| *H01L 23/373* | (2006.01) |

(52) U.S. Cl.
CPC ............ *B64G 1/506* (2013.01); *F28D 21/00* (2013.01); *F28F 13/00* (2013.01); *H01L 23/3736* (2013.01); *H01L 23/42* (2013.01); *H01L 23/427* (2013.01); *H05K 7/2049* (2013.01); *H05K 7/20454* (2013.01); *F28F 2013/008* (2013.01); *F28F 2255/04* (2013.01)

(58) Field of Classification Search
None
See application file for complete search history.

(56) References Cited

U.S. PATENT DOCUMENTS

| | | | |
|---|---|---|---|
| 5,651,414 A * | 7/1997 | Suzuki | ............... F28D 15/0275 |
| | | | 165/104.14 |
| 6,175,989 B1 * | 1/2001 | Carpenter | ............. B64G 1/222 |
| | | | 136/245 |
| 7,878,459 B2 | 2/2011 | Mabe et al. | |

(Continued)

*Primary Examiner* — Courtney L Smith
(74) *Attorney, Agent, or Firm* — Moore Intellectual Property Law, PLLC

(57) ABSTRACT

An apparatus includes a thermally conductive interface assembly including a first component associated with a first interface surface and a second component associated with a second interface surface. The apparatus also includes a shape memory alloy component coupled to the thermally conductive interface assembly and configured to move one or more components of the thermally conductive interface assembly between a first state and a second state based on a temperature of the shape memory alloy component. In the first state, the first interface surface is in physical contact with the second interface surface, and in the second state, a gap is defined between the first interface surface and the second interface surface.

20 Claims, 10 Drawing Sheets

(56) References Cited

U.S. PATENT DOCUMENTS

| | | | |
|---|---|---|---|
| 8,876,062 B1* | 11/2014 | Baghdasarian | B64G 1/66 244/172.6 |
| 9,470,437 B2 | 10/2016 | Gray et al. | |
| 2003/0123952 A1* | 7/2003 | Unsworth | F16B 25/0047 411/412 |
| 2004/0048497 A1* | 3/2004 | Hougham | H05K 7/1061 439/65 |
| 2007/0171609 A1* | 7/2007 | Kehl | H05K 7/20209 361/690 |
| 2007/0201210 A1* | 8/2007 | Chow | H05K 7/20772 361/704 |
| 2008/0273308 A1* | 11/2008 | Kells | H01L 23/40 361/704 |
| 2009/0043288 A1* | 2/2009 | Petrakis | G01K 5/483 604/890.1 |
| 2010/0167636 A1* | 7/2010 | Bhattacharya | H05K 5/0213 454/239 |
| 2013/0314202 A1* | 11/2013 | Bolton | H01L 23/34 337/299 |
| 2014/0090816 A1* | 4/2014 | Yang | F28D 15/0241 165/104.26 |

* cited by examiner

SYSTEM AND METHOD FOR SHAPE MEMORY ALLOY THERMAL INTERFACE

CROSS-REFERENCE TO RELATED APPLICATION

The present application claims priority from and is a continuation of U.S. patent application Ser. No. 15/494,315, filed on Apr. 21, 2017, the contents of which is hereby incorporated by reference in its entirety.

FIELD OF THE DISCLOSURE

The present disclosure is generally related to thermal interfaces using shape memory alloys.

BACKGROUND

A thermal interface transfers heat between two objects, such as a heat source and a heat sink. A thermal interface is often used to remove heat generated from an electronic device. A small temperature difference between a hot side and a cold side of the thermal interface (e.g., when the thermal interface is exposed to external or environmental loads, such as higher temperatures/solar radiation) causes the thermal interface to become less effective at rejecting heat from the electronic device. In some operating conditions, the thermal interface is unable to remove a sufficient amount of heat from the electronic device or actually transfers heat from the external source or environment to the electronic device, thus damaging the electronic device.

In the context of a spacecraft (e.g., a spaceship, a satellite, or a space station), as the spacecraft operates (e.g., orbits an astronomical body) the spacecraft typically has one surface that experiences relatively high environmental loading and has another surface that experiences relatively low environmental loading. For example, the surface of the spacecraft that faces the Sun experiences high solar radiation and temperatures as compared to the surface of the spacecraft facing away from the Sun. The surface that faces the Sun may change over time as the spacecraft operates. In some operating conditions, the surface that faces the Sun cannot be used effectively to transfer or reject heat into space from the spacecraft and/or electronic devices thereof.

Additionally, generally only surfaces that are protected from high levels of solar radiation can be used as radiative surfaces. This limitation on which surfaces can be used means that some surfaces (e.g., surfaces that face the Sun) cannot be used to reject heat. Alternatively, complicated protection schemes, such as a thermal shield (e.g., louvers or blinds) may be used to reflect solar radiation from the Sun and reduce the amount of solar radiation absorbed by the radiative surfaces and the thermal interface. Variable conductance heat pipes may be used throughout the spacecraft to transfer heat from electronic devices to a radiative surface that transfers (e.g., rejects) heat into space. Alternatively, a spacecraft may include heat pumps to transfer (or pump) the heat from the electronic device to the radiative surface. These solutions to reject heat energy add complexity, weight, and volume to spacecraft design. In the context of a spacecraft, these factors greatly increase cost.

SUMMARY

In a particular implementation, an apparatus includes a thermally conductive interface assembly including a first component associated with a first interface surface and a second component associated with a second interface surface. The apparatus also includes a shape memory alloy component coupled to the thermally conductive interface assembly and configured to move one or more components of the thermally conductive interface assembly between a first state and a second state based on a temperature of the shape memory alloy component. In the first state, the first interface surface is in direct physical contact with the second interface surface, and in the second state, a gap is defined between the first interface surface and the second interface surface.

In another particular implementation, a spacecraft includes an electronic device and one or more heat pipes coupled to the electronic device. The spacecraft also includes a thermally conductive interface assembly coupled to the one or more internal heat pipes. The thermally conductive interface assembly includes a first component that has a first interface surface and a second component that has a second interface surface. The spacecraft further includes a shape memory alloy component coupled to the thermally conductive interface assembly and configured to move one or more components of the thermally conductive interface assembly between a first state and a second state based on a temperature of the shape memory alloy component. In the first state, the first interface surface is in physical contact with the second interface surface, and in the second state, a gap is defined between the first interface surface and the second interface surface.

In another particular implementation, a method of transferring heat from a spacecraft includes moving, by a shape memory alloy component of a thermally conductive interface assembly, one or more components of the thermally conductive interface assembly from a first state to a second state responsive to a first temperature. In the first state, a first interface surface of the thermally conductive interface assembly is in physical contact with a second interface surface of the thermally conductive interface assembly, and in the second state, a gap is defined between the first interface surface and the second interface surface. The method also includes moving, by the shape memory alloy component, the one or more components of the thermally conductive interface assembly from the second state to the first state responsive to a second temperature.

DETAILED DESCRIPTION

Figure 1:
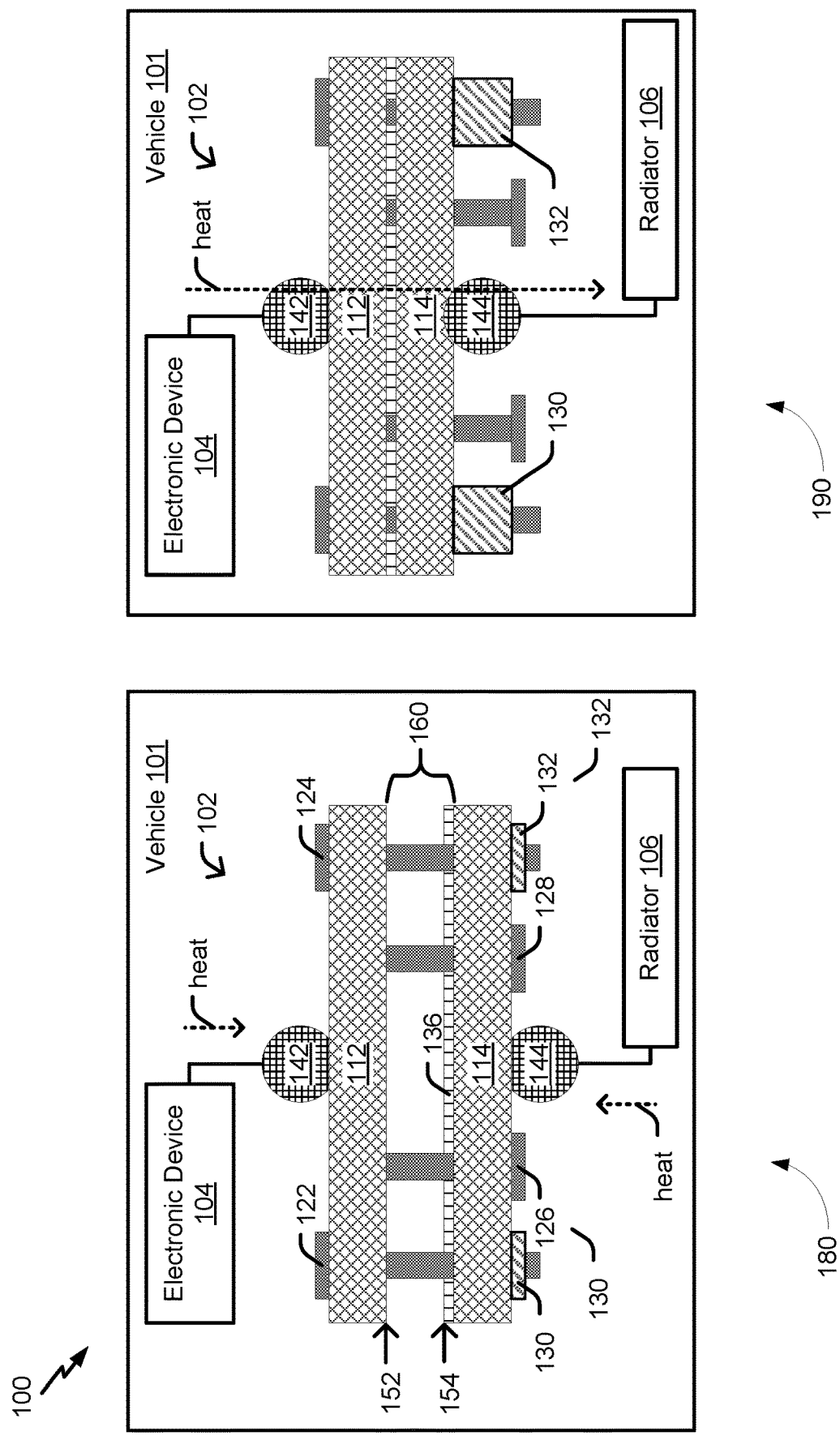
FIG. 1 is a diagram that illustrates an example of a thermally conductive interface assembly.

Implementations disclosed herein are directed to a thermal interface assembly including shape memory alloy components and having a variable conductance thermal interface. For example, components of the thermal interface assembly are movable to couple (e.g., mate) and decouple (e.g., separate) a conductive thermal interface of the thermal interface assembly using the shape memory alloy components. A thermal interface assembly having a variable conductance thermal interface can be used in a vehicle (e.g., a spacecraft) to control heat rejection from the vehicle and electronic devices thereof. The thermal interface assembly may be coupled to a radiator (e.g., an exterior surface) to selectively control heat rejection. For example, the thermal interface assembly enables heat transfer when the conductive thermal interface is coupled and impedes heat transfer when decoupled. The variable conductance thermal interface may enable any surface of the vehicle to be used for selective heat rejection without adding heavy and/or complicated thermal barriers or control systems.

An exemplary thermal interface assembly includes a first component, a second component, one or more fasteners, and a shape memory alloy component. A first surface of the first component, a thermal interface material or materials, and a second surface of the second component form a thermal interface of the thermal interface assembly. The thermal interface allows conductive heat transfer between the first component, the thermal interface material(s), and the second component when the thermal interface is closed (e.g., conductive heat path from the first surface to the second surface via the thermal interface) and prevents conductive heat transfer between the first component and the second component when the thermal interface is open (e.g., the surfaces are not in contact via the thermal interface material). In some implementations, a heat pipe is coupled to each of the first component and the second component to provide heat to and remove heat from the thermal interface.

For example, a first heat pipe removes heat from an electronic device inside the vehicle and transfers the heat to the thermal interface assembly via conduction and radiation (and possibly convection if a fluid is present, such as air). A second heat pipe is coupled to a radiator (e.g., an exterior surface). When solar radiation input to the radiator is low (e.g., the radiator faces away from the Sun or is coupled to a surface that faces away from the Sun), the second heat pipe receives heat (via conduction) across the thermal interface from the first heat pipe and transfers the heat to the radiator by conduction and radiation (and possibly convection if a fluid is present, such as air). When solar radiation input is high (e.g., the radiator faces the Sun or is coupled to a surface that faces the Sun) and the surfaces of thermal interface assembly are not in contact, heat is absorbed by the radiator and the second heat pipe, but the heat is not transferred across the thermal interface by conduction.

The shape memory alloy component rearranges its shape or configuration based on temperature and exerts a relatively large force (compared to other metals during thermal expansion and contraction) during rearrangement. The rearranged shape may be an expanded shape, a compressed shape, a twisted shape, an untwisted shape, etc. The rearranged shape of the shape memory alloy component can be utilized to generate a force to bias or move the thermal interface assembly between states. For example, a first state corresponds to an open state where the first surface and the second surface are not in contact, and a second state corresponds to a closed state where the first surface and the second surface are in contact (either directly or via a thermal interface material). In the first state, the first surface and second surface are separated by an insulator (e.g., an air or a vacuum gap). The thermal interface assembly has different conductive heat transfer characteristics (e.g., a lower heat transfer coefficient) in the first state as compared to the second state (e.g. the closed state). However, some conductive heat transfer may still occur in the first state via the fasteners. In the second state (e.g., the closed state) the first surface and the second surface are in contact via a thermally conductive material (e.g., a thermal interface material) and exchange heat through conduction via the thermally conductive material.

In some implementations, the shape memory alloy component experiences a temperature change based on the environment directly (e.g., by absorbing solar radiation), indirectly (e.g., by receiving energy from the solar radiation through conduction), or both. In response to the shape memory alloy component reaching a first temperature, the shape memory alloy experiences a solid-state phase change and reconfigures to a "programmed state". In some implementations, the shape memory alloy component reconfigures to a "second programmed state" in response to reaching a second temperature. The shape memory alloy may exhibit hysteresis, that is the solid-state transition between the programmed states may occur at different temperatures depending on a current state. Accordingly, the first temperature may be different than the second temperature.

In other implementations, the shape memory alloy component is coupled to or includes a heating element that is configured to provide heat to the shape memory alloy component. The temperature of the shape memory alloy component can be controlled to control rejection of heat. For example, the heating element can heat the shape memory alloy component to the first temperature or to the second temperature to move (e.g., configure) the thermal interface assembly to the first state or to the second state.

Depending on the configuration of the thermal interface assembly and the how the shape memory alloy is programmed (e.g., formed or trained), the thermal interface assembly can be configured such that the thermal interface is open when the shape memory alloy component is hot or when the shape memory alloy component is cold. Said another way, the thermal interface assembly may be configured such that the shape memory alloy component is configured to generate a force to bias the thermal interface open or to bias the thermal interface closed. To illustrate, the shape memory alloy component can be configured (e.g., programmed or trained) to expand or to compress at hot temperatures to generate a force. The force generated by the shape memory alloy component is used to bias the thermal interface assembly towards the first state or toward the second state. As an illustrative example, an increase in temperature causes the shape memory alloy to expand and to exert a force to open the thermal interface or causes the shape memory alloy to contract or compress and to exert force to close the thermal interface.

Generally, a shape memory alloy component exerts a larger force as the shape memory alloy component transitions from a lower temperature solid state (martensite) into a higher temperature solid state (austenite) and exerts a smaller force as the shape memory alloy component cools from the higher temperature solid state (austenite) into the lower temperature solid state (martensite). Additionally, during cooling and when in the lower temperature solid state (martensite), the shape memory alloy component can be more readily deformed by external forces as compared to during heating and when in the higher temperature solid state (austenite). Even when a shape memory alloy component is programmed or trained to have a compressed shape (e.g., shorter beam length, less thickness, or both as compared to an original shape or expanded shape) when in the higher temperature solid state (austenite), the shape memory alloy component still generates greater forces when transition to the higher temperature solid state (austenite) than when transitioning to the lower temperature solid state (martensite). Accordingly, the shape memory alloy component generally generates greater forces during reconfiguration (or transformation) to a programmed or a trained shape (e.g., a shape associated with the austenite state) than forces generated during reconfiguration to an unprogrammed or untrained shape (e.g., a shape associated with the martensite state). The difference in forces may be used to control movement of the thermal interface assembly when balanced against external loads generated by other components, such as fasteners and springs.

By using a thermal interface with shape memory alloy component or components to control heat transfer, the vehicle is smaller, lighter, and has reduced costs as compared to systems that use thermal shields, variable conductance heat pipes, or heat pumps. In the context of a spacecraft, the spacecraft would have reduced materials costs and reduced launching costs. In addition, the spacecraft, or rockets that launch the spacecraft into space have fixed payload weights and physical size requirements. Additionally, the thermal interface enables selection or control of heat transfer properties and enables increased heat transfer efficiency. For example, more surfaces of the vehicle or a larger portion of the surface of the vehicle can be used to reject heat.

FIG. 1 is a diagram 100 that illustrates an example of a thermally conductive interface assembly 102. In FIG. 1, the diagram 100 includes a first representation of the thermally conductive interface assembly 102 in a first state 180 and a second representation of the thermally conductive interface assembly 102 in a second state 190. In some implementations, the thermally conductive interface assembly 102 is included in a vehicle 101 (e.g., a spacecraft) and is coupled to an electronic device 104 thereof, as shown in FIG. 1. The thermally conductive interface assembly 102 may be included in a heat rejection system of the vehicle 101 to control or regulate rejection of heat from the vehicle 101, from the electronic device 104, or both. In some implementations, control of the thermally conductive interface assembly 102 is passive, as described further with reference to FIGS. 2 and 3. Additionally, or alternatively, the thermally conductive interface assembly 102 (or a portion thereof) can be actively controlled, as described further with reference to FIGS. 4 and 5.

The thermally conductive interface assembly 102 includes a first component 112 associated with a first interface surface 152 and a second component 114 associated with a second interface surface 154 that opposes the first interface surface 152. The first interface surface 152 and the second interface surface 154 define a gap 160 depending on a state of the thermally conductive interface assembly 102. For example, the first interface surface 152 and the second interface surface 154 define the gap 160 in the first state 180 and are in contact in the second state 190 (e.g., the thermally conductive interface assembly 102 does not include the gap 160 in the second state 190). The first interface surface 152 and the second interface surface 154 are in contact when the first interface surface 152 is in conductive contact with the second interface surface 154, such as directly or via one or more thermal materials or layers of conductive materials. The first interface surface 152 and the second interface surface 154 are not in conductive contact when an insulator (e.g., the gap 160) separates the first interface surface 152 and the second interface surface 154. The gap 160 may include air or, such as when in space, nothing (e.g., a vacuum). In some implementations, the thermally conductive interface assembly 102 includes a third state having a smaller gap than the gap 160.

In some implementations, such as illustrated in FIG. 1, the first interface surface 152 corresponds to a first surface of the first component 112 and the second interface surface 154 corresponds to a surface of a thermal interface material 136 associated with (e.g., coupled to) the second component 114. The thermal interface material 136 may be coupled to the first interface surface 152, the second surface of the second component 114, or both. As illustrated in FIG. 1, the thermal interface material 136 is coupled to the second surface of the second component 114. The thermal interface material 136 includes or corresponds to a solid material (e.g., a gasket or a thermal pad) or a gel material (e.g., a thermal compound or paste). The thermal interface material 136 is configured to increase thermal contact and thermal conduction between the first interface surface 152 and the second interface surface 154. For example, the thermal interface material 136 fills in gaps between the first interface surface 152 and the second interface surface 154 that would otherwise be filled with air (or in the context of space, nothing). In some implementations, the thermal interface material 136 includes a shape memory alloy component, as described further with to FIGS. 7 and 8. In other implementations, the first interface surface 152, both of the interface surfaces 152 and 154, or neither of the interface surfaces 152 and 154 correspond to a surface of a thermal interface material. In a particular implementation, the first component 112 includes the first interface surface 152 and the second component 114 includes the second interface surface 154.

The thermally conductive interface assembly 102 includes one or more fasteners, such as fasteners 122-132. The fasteners 122-132 are configured to couple together components of the thermally conductive interface assembly 102 and to move one or more component of the thermally conductive interface assembly 102. For example, a first subset of fasteners may be configured such that the first subset fasteners exert a force to bias the thermally conductive interface assembly 102 towards the first state 180 and a second subset of fasteners may exert a force to bias the thermally conductive interface assembly 102 towards the second state 190. The fasteners 122-132 include or correspond to bolts, screws, rivets, staples, pins, nails, nuts, washers, caps, springs, Belleview washers, etc.

The thermally conductive interface assembly 102 includes at least one shape memory alloy component. For example, one or more fasteners of the fasteners 122-132, the thermal interface material 136, or a combination thereof, include or correspond to a shape memory alloy component. As illustrated in FIG. 1, the fasteners 130 and 132 are shape memory alloy components (also referred to as shape memory alloy components 130 and 132). In another particular implementation, the shape memory alloy component includes or corresponds to a camshaft that is configured to rotate a cam. Rotation of the cam generates a force to bias the thermally conductive interface assembly 102 towards the second state 190, as further described with reference to FIG. 6.

The shape memory alloy component is configured to change (e.g., reconfigure) to a programmed shape based on temperature and to undergo a relatively large displacement and exert a large force (compared to other metals during expansion and contraction). The programmed shape may correspond to an expanded shape, a compressed shape, a bent shape, a flattened shape, a twisted shape, or an untwisted shape, relative to an original shape. The programmed shape of the shape memory alloy is utilized to vary a conductive thermal interface of the thermally conductive interface assembly 102. As compared to non-shape memory metals or alloys, shape memory alloys are capable of being programmed or trained for either compression or expansion (e.g., extension) upon an increase in temperature. By using a shape memory alloy component that is programmed or trained to compress upon heating, the two interface surfaces 152 and 154 can be reconfigured from the first state 180 with the gap 160 to the second state 190 (e.g., a thermally conductive state) by heating the shape memory alloy components which undergo a compressive shape change, as described further with reference to FIGS. 2 and 5. Additionally or alternatively, the shape memory alloy components can be programmed or trained to expand when heated to open the thermal interface (e.g., separate the first interface surface 152 from the second interface surface 154 and thermal interface material 136.), as described further with reference to FIGS. 3, 4, 7, and 8. Additionally, shape memory alloy components experience relatively large changes in shape and exert relatively large forces in response to temperature changes as compared to non-shape memory metal alloy components. For example, the martensite to austenite phase change that corresponds to a transition from a lower temperature to a higher temperature can generate dimension changes as large as 8% in the tensile or shear modes. Additionally, relatively small temperature changes may cause a shape memory alloy component to experience relatively large changes in shape as compared to non-shape memory metal alloy components.

The shape memory alloy component changing shape may generate an additional force which biases the thermally conductive interface assembly 102 towards a particular state (e.g., the first state 180) or may increase an existing force which biases thermally conductive interface assembly 102 towards the particular state. Additionally or alternatively, the shape memory alloy component changing shape may reduce an existing force (or cause a reduction in an existing force) which biases thermally conductive interface assembly 102 towards the other state (e.g., the second state 190). The additional force or reduction to the existing force changes a balance of forces of the thermally conductive interface assembly 102 such that the thermally conductive interface assembly 102 switches from the particular state to the other state.

In some implementations, the shape memory alloy component includes or corresponds to a one-way memory shape memory alloy. A one-way memory shape memory alloy has one programmed shape response to receiving heat. In other implementations, the shape memory alloy component corresponds to a two-way memory shape memory alloy. A two-way memory shape memory alloy has two programmed shapes, a first programmed shape responsive to a first temperature (e.g., a higher temperature) and a second programmed shape responsive to a second temperature (e.g., a lower temperature). The shape memory alloy component may include alloys of two or more metals, such as aluminum, copper, gold, hafnium, indium, iron, lead, nickel, magnesium, silver, titanium, zinc, etc. As illustrative, non-limiting examples, the shape memory alloy component includes a nickel and titanium alloy (e.g., nitinol) or a copper and aluminum alloy.

In another particular implementation, the shape memory alloy component is a sub-component of the fasteners 122-132 or the thermal interface material 136. In such implementations, the shape memory alloy component includes or corresponds to tubing, threads, caps, pins, posts, or notches of shape memory alloy material that are combined with or coupled to a particular fastener of the fasteners 122-132 or the thermal interface material 136. For example, in a particular implementation the fastener 126 includes a steel screw with a steel head at a first end (e.g., a proximal end), a steel shank and/or threads, and a shape memory alloy cap or pins at a second end (e.g., a distal end). Thus, as the shape memory alloy cap or pins at the second end reconfigure (e.g. expand) and exert a force against the first component 112, the first interface surface 152 and the second interface surface 154 separate to form the gap 160.

The thermally conductive interface assembly 102 may further include one or more heat pipes, such as a first heat pipe 142 and a second heat pipe 144 configured to exchange heat via the thermal interface. As illustrated in FIG. 1, the first heat pipe 142 (e.g., an internal heat pipe) is coupled to the first component 112 and the second heat pipe 144 (e.g., an external heat pipe) is coupled to the second component 114.

In some implementations, the thermally conductive interface assembly 102 is coupled to a heat source, such as the electronic device 104. In the exemplary implementation illustrated in FIG. 1, the electronic device 104 is coupled to the first heat pipe 142 of the thermally conductive interface assembly 102. In other implementations, the electronic device 104 is coupled to the first component 112 directly or via another thermal interface.

In some implementations, the thermally conductive interface assembly 102 is coupled to a radiator 106 (e.g., a radiative surface) configured to reject or dissipate heat by radiation (and possibly convection) to an environment. In a particular implementation, the radiator 106 is coupled to the second heat pipe 144 and corresponds to an exterior surface of the vehicle 101. In other implementations, the second component 114 and/or the second heat pipe 144 may function as the radiator 106.

During operation of the vehicle 101, the electronic device 104 operates and generates heat. Additionally, during the operation of the vehicle 101, an exterior surface of the vehicle 101 that is coupled to the second heat pipe 144 may face the Sun and be externally loaded at a first time by solar radiation and may face away from the Sun and not be externally loaded by solar radiation at a second time. At the first time, the shape memory alloy components 130 and 132 of the thermally conductive interface assembly 102 reach the first temperature responsive to receiving (directly or indirectly) thermal energy from the Sun. Responsive to the first temperature, the shape memory alloy components 130 and 132 experience a solid-state phase change (e.g., martensite to austenite) and generate or cause a force to bias the thermally conductive interface assembly 102 towards the first state 180 (open the thermal interface or create the gap 160 as illustrated in FIG. 1). For example, the force generated by the shape memory alloy components 130 and 132 causes the shape memory alloy components 130 and 132 to transform to the compressed shape which reduces a force, generated by one or more of the fasteners 122-132, that biases the thermally conductive interface assembly 102 towards the second state 190. The reduced force biasing the thermally conductive interface assembly 102 towards the second state 190 is overcome by a force that is generated by one or more other components (e.g., the fasteners 126 and 128, a spacer, a spring, etc.) and that biases the thermally conductive interface assembly 102 towards the first state 180, resulting in the thermally conductive interface assembly 102 having the first state 180. Additionally or alternatively, the compressed shape (e.g., a reduced volume of the compressed shape) allows the force generated by the one or more other components to bias the thermally conductive interface assembly 102 towards the first state 180. For example, the reduced volume of the compressed shape shifts a static equilibrium point of the thermally conductive interface assembly 102 from being associated with the second state 190 to being associated with the first state 180.

In the implementation illustrated in FIG. 1, a first fastener 122 and a second fastener 124 correspond to bolts, a third fastener 126 and a fourth fastener 128 correspond to screws, and a fifth fastener 130 and a sixth fastener 132 correspond to nuts or washers. The fasteners 122-128 exert a force that biases the thermally conductive interface assembly 102 towards the second state 190. The fasteners 130 and 132 selectively exert a force that biases the thermally conductive interface assembly 102 towards the first state 180 based on temperature. In the implementation illustrated in FIG. 1, the fifth fastener 130 and the sixth fastener 132 have a compressed shape responsive to first temperature.

In the first state 180, the heat generated by the electronic device 104 and heat within the vehicle 101 is not conductively transferred from the first heat pipe 142 to the second heat pipe 144 via the thermal interface (i.e., contact between the first interface surface 152, the thermal interface material 136, and the second interface surface 154). A portion of the heat generated by the electronic device 104 and a portion of the heat within the vehicle 101 is still conductively transferred via the second component 114, the fasteners 122-128, and the first component 112. Additionally, heat (e.g., solar radiation) from the radiator 106 is not conductively transferred from the second heat pipe 144 to the first heat pipe 142 via the thermal interface in the first state 180. As compared to the second state 190, less heat from the radiator 106 is conductively transferred from the second heat pipe 144 to the first heat pipe 142 via the second component 114, the fasteners 122-128, and the first component 112. Thus, thermally conductive interface assembly 102 blocks or prevents absorption of a portion of solar radiation in the first state 180.

While in the first state 180, the heat generated by the electronic device 104 and the heat within the vehicle 101 may be rejected via another radiator (not shown) of the vehicle 101. In some implementations, the other radiator (e.g., an exterior surface that is facing away from the Sun) is coupled to another thermally conductive interface assembly of the vehicle 101. In a particular implementation, the other thermally conductive interface assembly is in the second state 190 at the first time and while the thermally conductive interface assembly 102 is in the first state 180.

At the second time, the shape memory alloy components 130 and 132 of the thermally conductive interface assembly 102 reaches the second temperature responsive to receiving (directly or indirectly) relatively less thermal energy from the Sun. Responsive to reaching the second temperature, the shape memory alloy components 130 and 132 experience a solid-state phase change (e.g., austenite to martensite) and cease to generate or cause the force to bias the thermally conductive interface assembly 102 towards the first state 180 (open the thermal interface or create the gap 160 as illustrated in FIG. 1). Responsive to the shape memory alloy components 130 and 132 ceasing to generate or cause the force to bias the thermally conductive interface assembly 102 towards the first state 180, the force generated by the one or more of the fasteners 122-132 biases the thermally conductive interface assembly 102 towards the second state 190 (close the thermal interface and eliminate the gap 160).

In the second state 190, the heat generated by the electronic device 104 can be conductively transferred from the first heat pipe 142 to the second heat pipe 144 via the thermal interface (i.e., by physical or thermal contact between the first interface surface 152 and the second interface surface 154). Additionally, the heat generated by the electronic device 104 can be transferred from the second heat pipe 144 to the radiator 106 where the heat can be rejected. The radiator 106 may include or correspond to an exterior surface of the vehicle 101. In such implementations, the thermally conductive interface assembly 102 may be included in a close-out panel of the vehicle 101. In the first state 180, the thermal interface assembly has different conductive heat transfer characteristics (e.g., a lower heat transfer coefficient) as compared to the second state 190.

In other implementations, a shape memory alloy component of the thermally conductive interface assembly 102 reconfigures to generate a force to bias the thermally conductive interface assembly 102 towards the second state 190 (close the thermal interface and eliminate the gap 160). In such implementations, the shape memory alloy component reconfigures to an expanded shape, a compressed shape, a twisted shape, or an untwisted shape. Additionally, the thermally conductive interface assembly 102 may include other components, such a heating element, a controller, one or more fastener connectors (e.g., heat spreaders), as described further herein.

Therefore, a thermally conductive interface assembly can be designed such that the thermally conductive interface assembly is configured to selectively transfer heat from a vehicle or an electronic device thereof based on an amount of solar radiation received by the thermally conductive interface assembly. Accordingly, a vehicle can use any exterior surface as a radiator and the thermally conductive interface assembly can self-regulate when to reject heat and when to stop rejecting heat (or reduce heat transfer into the vehicle). The thermally conductive interface assembly has reduced costs as compared to existing implementations because the thermally conductive interface assembly is lighter and takes up less space than existing implementations. As the thermally conductive interface assembly is less complex (e.g., does not require an electric motor to drive louvers or blinds) the thermally conductive interface assembly is more reliable.

Figure 2:
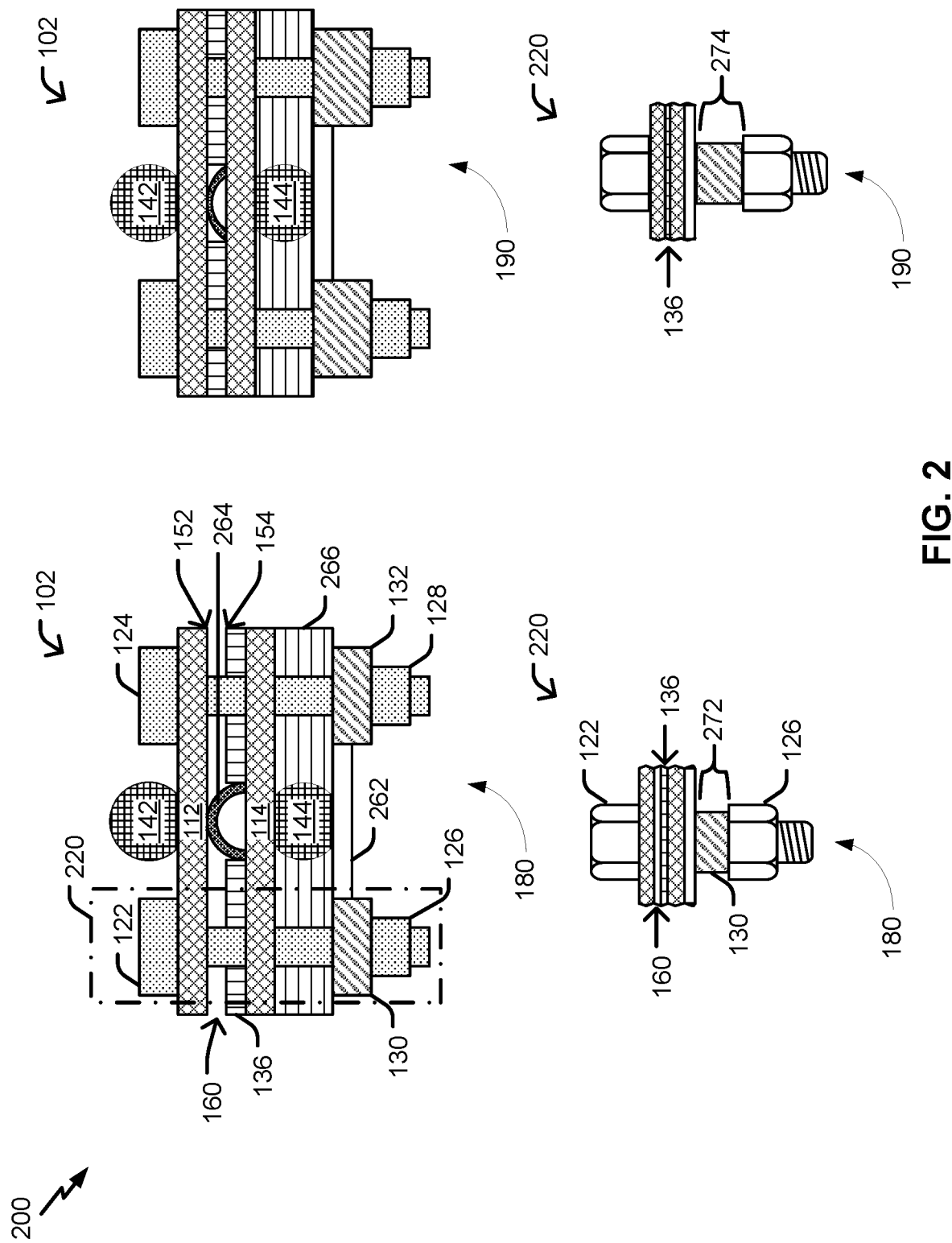
FIG. 2 is a diagram that illustrates an example of a thermally conductive interface assembly that is activated by environmental heating.
Figure 3:
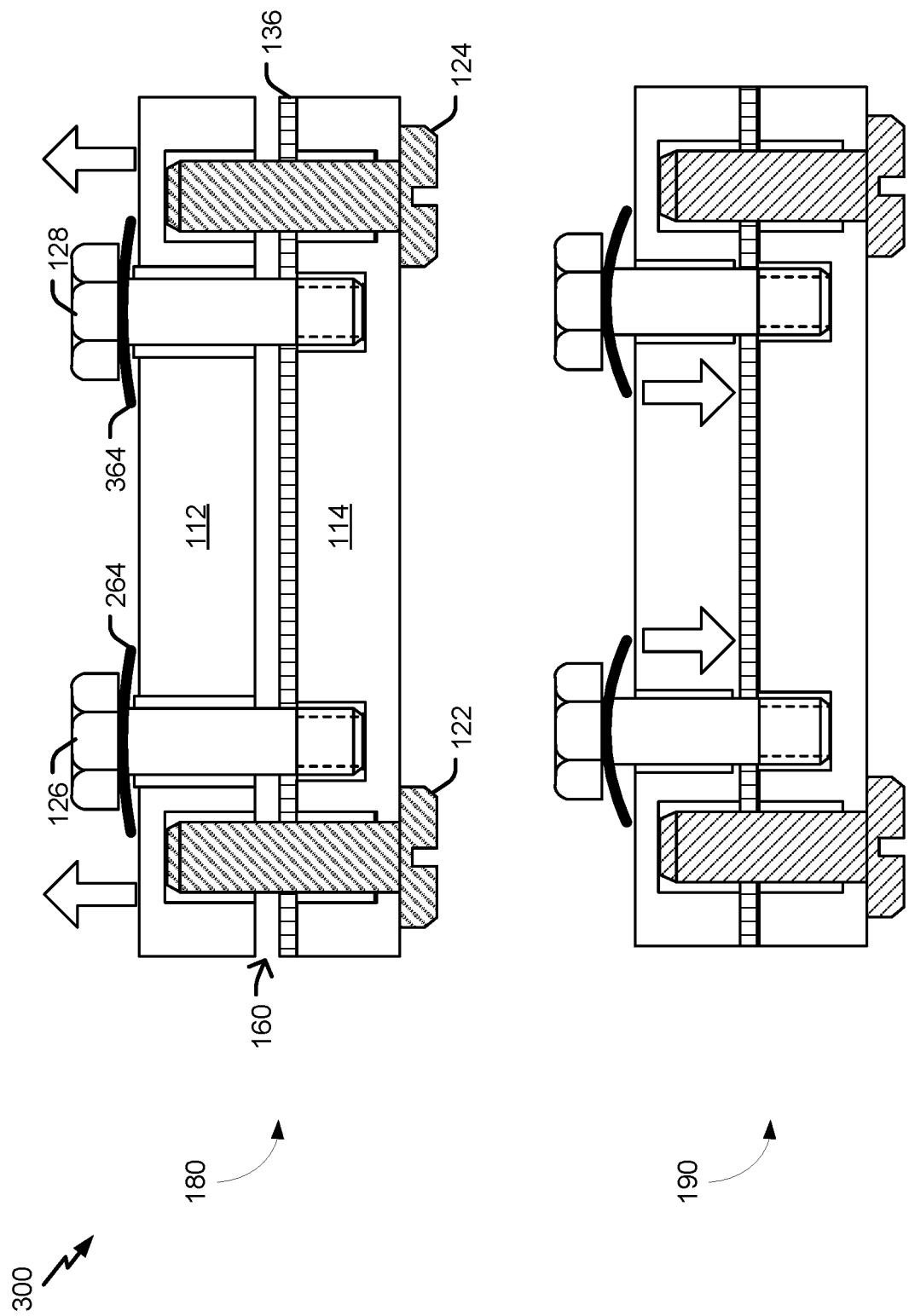
FIG. 3 is a diagram that illustrates another example of a thermally conductive interface assembly that is activated by environmental heating.

FIGS. 2 and 3 illustrate examples of a passively controlled (e.g., environmentally controlled or activated) thermally conductive interface assembly. Referring to FIG. 2, a diagram 200 depicts an example of a first representation of the thermally conductive interface assembly 102 in the first state 180 and a second representation of the thermally conductive interface assembly 102 in the second state 190. In the implementation illustrated in FIG. 2, each of the first fastener 122 and the second fastener 124 correspond to a bolt, each of the fifth fastener 130 and the sixth fastener 132 correspond to a shape memory alloy washer, and each of the third fastener 126 and the fourth fastener 128 correspond to a nut.

The thermally conductive interface assembly 102 further includes a spacer 264 coupled to the first interface surface 152 or the second interface surface 154. The spacer 264 is configured to exert a force to bias the thermally conductive interface assembly 102 towards the first state 180. In other implementations, the spacer 264 is configured to exert a force to bias the thermally conductive interface assembly 102 towards the second state 190, as described with reference to FIG. 3. In some implementations, the spacer 264 includes or corresponds to a spring. In the particular implementation illustrated in FIG. 2, the spacer 264 corresponds to a Belleview washer (e.g., a conical or disk spring) coupled to the second interface surface 150.

In some implementations, the thermally conductive interface assembly 102 includes one or more fastener connectors 262 (e.g., heat spreaders) configured to absorb heat (e.g., solar radiation) and transfer the heat to one or more of the fasteners 122-132. In the implementation illustrated in FIG. 2, the fastener connector 262 is coupled to (e.g., in contact with) the fifth fastener 130 and the sixth fastener 132 and enables heat transfer between the fastener connector 262, the fifth fastener 130, and the sixth fastener 132. The fastener connector 262 includes a thermally conductive material. In a particular implementation, the fastener connector 262 (or a portion thereof) includes a coating or finish configured to increase absorption of solar radiation. In the implementation illustrated in FIG. 2, the thermally conductive interface assembly 102 may be included in a close-out panel 266 of a spacecraft. In this implementation, the first component 112 corresponds to an interior side of the spacecraft and the second component 114 corresponds to an exterior side (e.g., space) of the spacecraft.

A first fastener group 220 of the thermally conductive interface assembly 102 includes the first fastener 122, the third fastener 126, and the fifth fastener 130. The first fastener group 220 is configured to exert a force on the first component 112 and the second component 114 to bias the thermally conductive interface assembly 102 towards the second state 190.

In addition, the diagram 200 of FIG. 2 includes a first representation of the first fastener group 220 in the first state 180 and a second representation of the first fastener group 220 in the second state 190. As illustrated in FIG. 2, the fifth fastener 130 includes a shape memory alloy washer that has a first size 272 (e.g., a vertical dimension as illustrated in FIG. 2) at the first temperature and has a second size 274 at the second temperature. The first size 272 corresponds to the first state 180 of the thermally conductive interface assembly 102. As illustrated in FIG. 2, the first size 272 is smaller than the second size 274. In FIG. 2, the first size 272 corresponds to the compressed shape, and the second size 274 corresponds to an original or expanded shape.

During operation of the spacecraft, the spacecraft includes an exterior surface (e.g., the close-out panel 266) coupled to the second heat pipe 144 and coupled to one or more fasteners that face the Sun and that are externally loaded at a first time by solar radiation. At the first time, the shape memory alloy components 130 and 132 of the thermally conductive interface assembly 102 reaches the first temperature responsive to receiving (directly or indirectly) thermal energy from the Sun. Responsive to the first temperature, the shape memory alloy components 130 and 132 experience a solid-state phase change and reconfigure to a compressed shape (e.g., the first size 272). Reconfiguring to the compressed shape generates a force to bias the thermally conductive interface assembly 102 towards the first state 180 (open the thermal interface or create the gap 160 as illustrated in FIG. 1). The force generated by the shape memory alloy components 130 and 132 reduces a force generated by one or more of the fasteners 122-132 that biases the thermally conductive interface assembly 102 towards the second state 190. The reduced force biasing the thermally conductive interface assembly 102 towards the second state 190 is overcome by the force generated by the spacer 264 that biases the thermally conductive interface assembly 102 towards the first state 180. Additionally or alternatively, the compressed shape (e.g., a reduced force or reduced volume of the compressed shape) allows the force generated by the spacer 264 to bias the thermally conductive interface assembly 102 towards the first state 180.

In the first state 180, the heat within the spacecraft is not to be conductively transferred from the first heat pipe 142 to the second heat pipe 144 via the thermal interface (i.e., not conductively transferred by contact between the first interface surface 152, the thermal interface material 136, and the second interface surface 154). Additionally, heat (e.g., solar radiation) from the close-out panel 266 and exterior fasteners (e.g., the fasteners 126-132) is not conductively transferred from the second heat pipe 144 to the first heat pipe 142 via the thermal interface in the first state 180. The heat within the spacecraft may be rejected via another exterior surface (e.g., close-out panel 266), such as an exterior surface that is facing away from the Sun and is coupled to another thermally conductive interface assembly.

At a second time, the second heat pipe 144 and the one or more fasteners coupled to the exterior surface (e.g., the close-out panel 266) of the spacecraft face away from the Sun and are not externally loaded by solar radiation. At the second time, the shape memory alloy components 130 and 132 of the thermally conductive interface assembly 102 reaches the second temperature responsive to receiving (directly or indirectly) relatively less thermal energy from the Sun. Responsive to reaching the second temperature, the shape memory alloy components 130 and 132 experience a solid-state phase change and cease to generate the force to bias the thermally conductive interface assembly 102 towards the first state 180 (open the thermal interface or create the gap 160 as illustrated in FIG. 1). Responsive to the shape memory alloy components 130 and 132 ceasing to generate the force to bias the thermally conductive interface assembly 102 towards the first state 180, the force generated by the one or more of the fasteners 122-132 biases the thermally conductive interface assembly 102 towards the second state 190 (close the thermal interface and eliminate the gap 160). The force generated by the one or more of the fasteners 122-132 overcomes the force generated by the spacer 264. The first fastener group 220 still generates a net force to bias the thermally conductive interface assembly 102 towards the second state 190. In the second state 190, the heat within the spacecraft can be conductively transferred from the first heat pipe 142 to the second heat pipe 144 via the thermal interface (i.e., contact between the first interface surface 152 and the second interface surface 154). Additionally, the heat within the spacecraft can be transferred from the second heat pipe 144 to the close-out panel 266 and the exterior fasteners where the heat can be rejected.

In other implementations, a shape memory alloy component of the thermally conductive interface assembly 102 reconfigures to generate a force to bias the thermally conductive interface assembly 102 towards the second state 190 (close the thermal interface and eliminate the gap 160). In such implementations, the shape memory alloy component reconfigures to an expanded state, a twisted state, or an untwisted state.

Referring to FIG. 3, an example of a diagram 300 that includes a first representation of the thermally conductive interface assembly 102 in the first state 180 and a second representation of the thermally conductive interface assembly 102 in the second state 190 is illustrated.

In the implementation illustrated in FIG. 3, each of the first fastener 122 and the second fastener 124 corresponds to a shape memory alloy screw and each of the third fastener 126 and the fourth fastener 128 corresponds to a screw. The thermally conductive interface assembly 102 of FIG. 3 further includes one or more spacers coupled to one or more fasteners of the fasteners 122-128. The one or more spacers are configured to generate a force to bias the thermally conductive interface assembly 102 towards the second state 190. In the particular implementation illustrated in FIG. 3, the spacer 264 is coupled between the third fastener 126 and the first component 112 and a second spacer 364 is coupled between the fourth fastener 128 and the first component 112. The spacer 264 and the third fastener 126 and the second spacer 364 and the fourth fastener 128 exert forces to bias the thermally conductive interface assembly 102 towards the second state 190.

The operation of FIG. 3 is similar to FIG. 2. In FIG. 3, the first and second fasteners 122 and 124 include shape memory alloy material and generate the force to bias the thermally conductive interface assembly 102 towards the first state 180. In the particular implementation illustrated in FIG. 3, the first and second fasteners 122 and 124 correspond to shape memory alloy screws. The first and second fasteners 122 and 124 reconfigure to an expanded shape or an untwisted shape responsive to reaching the first temperature. Threads of the first and second fasteners 122 and 124 may be threaded with or into first component 112 or the second component 114. Depending on whether the threads are threaded with or into the first component 112 or the second component 114, the fastener will move an opposite component relative to a threaded component. For example, the first fastener 122 will move the first component 112 relative to the second component 114 when the first fastener 122 is threaded with the second component 114. Threads of the third and fourth fasteners 126 and 128 may be threaded with or into first component 112 or the second component 114 and with or into a component opposite the component that the first and second fasteners 122 and 124 are threaded with or into. For example, in the implementation illustrated in FIG. 3, the first and second fasteners 122 and 124 are threaded with the second component 114 and the third and fourth fasteners 126 and 128 are threaded with the first component 112.

Alternatively, the passively thermally conductive interface assemblies of FIG. 2 or FIG. 3 may be designed such that higher environmental loading closes the thermal interface. Such designs enable a system to utilize a thermally conductive interface assembly to reconfigure to reject heat or prevent absorption based on external or environmental conditions. For example, a passively cooled aircraft or building may reduce an amount of heat absorbed by a particular surface until such conditions exist where heat can be rejected from particular surface. To illustrate, a thermally conductive interface assembly of the aircraft or building may be designed such that the particular surface absorbs less heat when a temperature of the aircraft or building is at or below 72 degrees and enables rejection of heat when the temperature of the aircraft or building is above 72 degrees.

By using environmental activation, a thermally conductive interface assembly may have reduced costs, increased durability (e.g., no moving parts or electronics), and have smaller volume and weight, as compared to other thermal solutions and thermally conductive interface assemblies that include heating elements.

Figure 4:
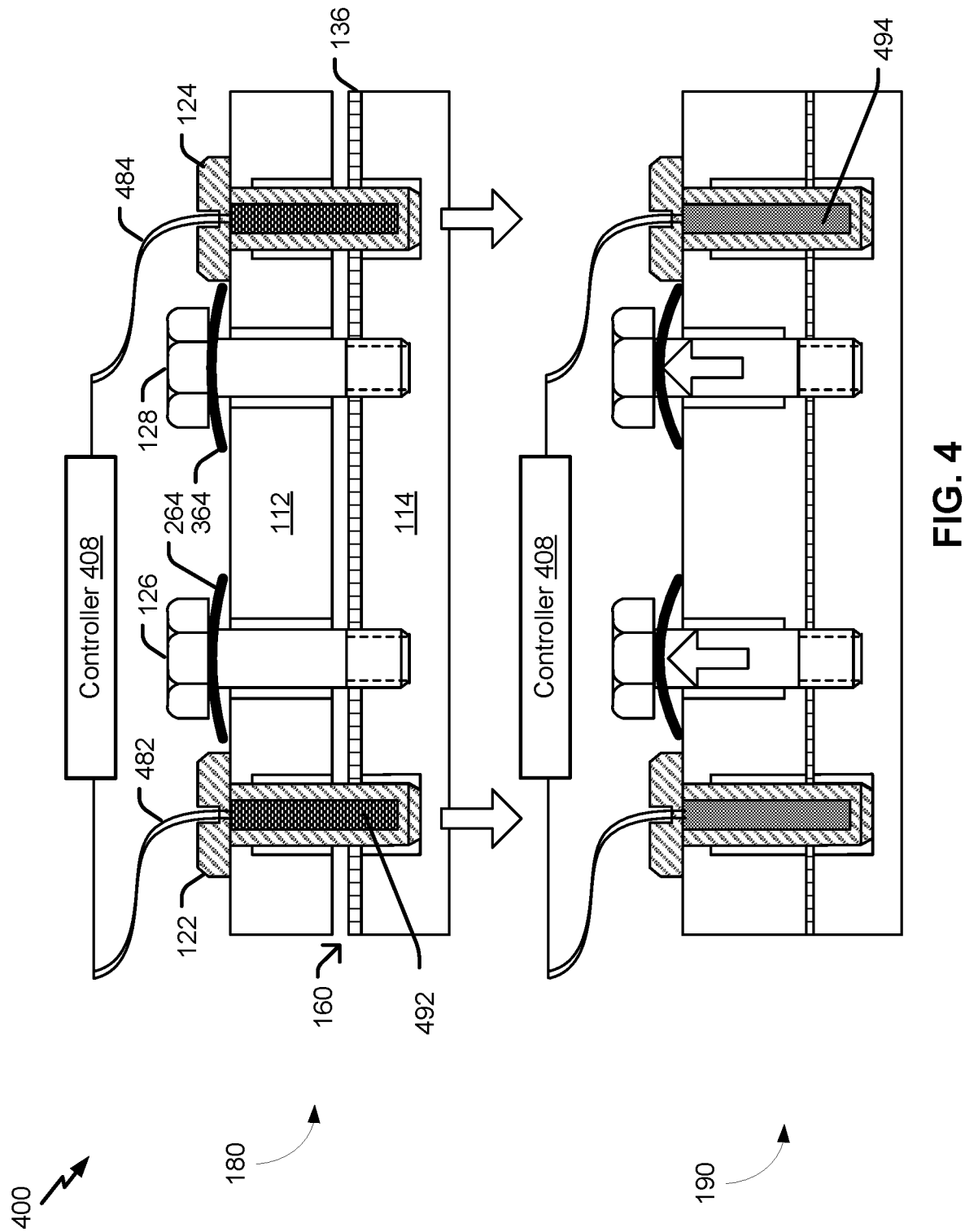
FIG. 4 is a diagram that illustrates an example of a thermally conductive interface assembly that includes a heating element.
Figure 5:
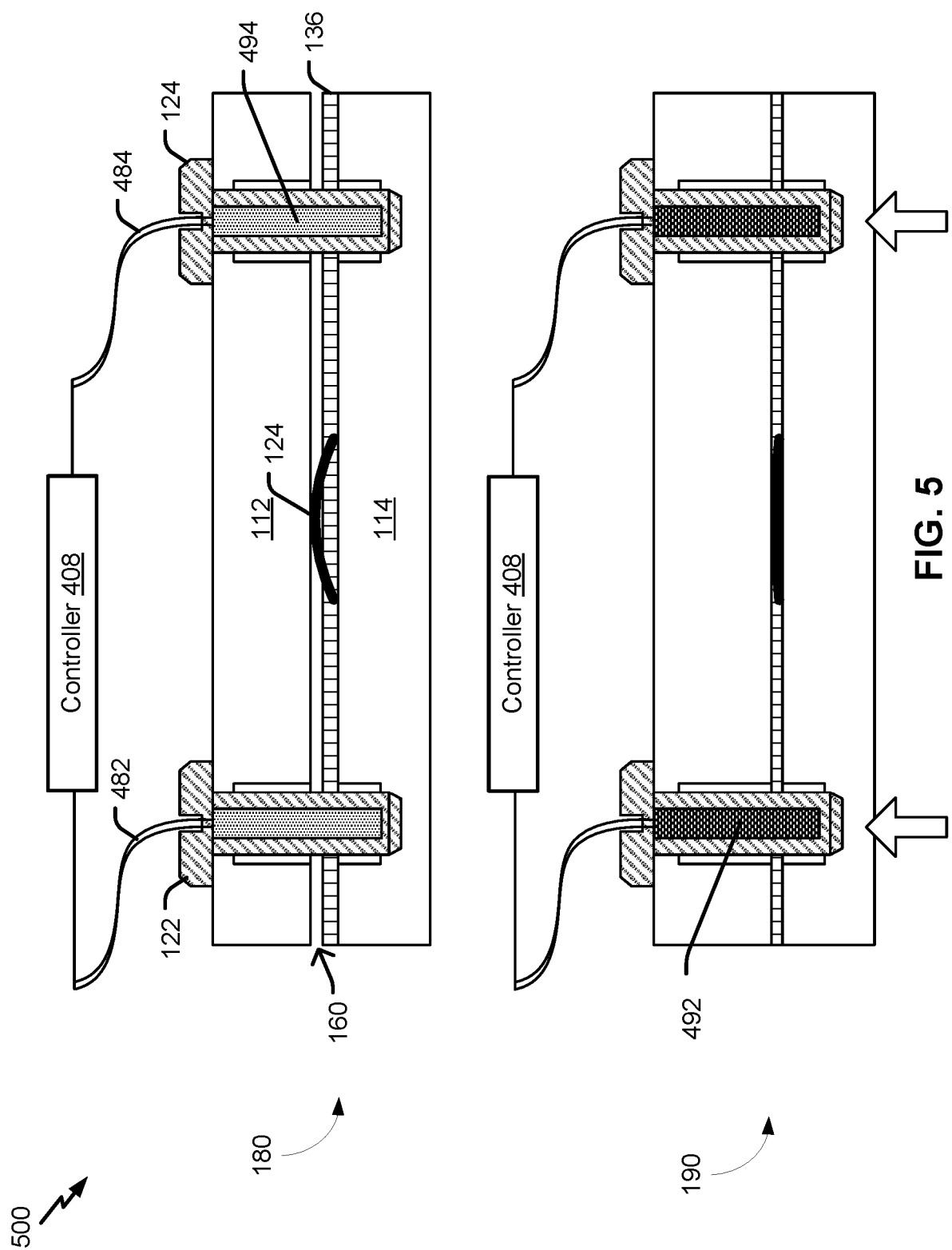
FIG. 5 is a diagram that illustrates another example of a thermally conductive interface assembly that includes a heating element.

FIGS. 4 and 5 illustrate examples of a thermally conductive interface assembly that includes a heating element. FIG. 4 illustrates a particular design of a thermally conductive interface assembly where active heating is configured to bias the thermal interface towards the first state 180 to open the gap 160. FIG. 5 illustrates a particular design of a thermally conductive interface assembly where active heating is configured to bias the thermally conductive interface assembly towards the second state 190 and to close the gap 160.

Referring to FIG. 4, an example of a diagram 400 that includes a first representation of the thermally conductive interface assembly 102 in the first state 180 and a second representation of the thermally conductive interface assembly 102 in the second state 190 is illustrated. In the implementation illustrated in FIG. 4, each of the first fastener 122 and the second fastener 124 corresponds to a shape memory alloy screw and each of the third fastener 126 and the fourth fastener 128 corresponds to a screw. Threads of the first and second fasteners 122 and 124 may be threaded with or into the first component 112 or the second component 114. Threads of the third and fourth fasteners 126 and 128 may be threaded with or into the first component 112 or the second component 114. Additionally, the threads of the third and fourth fasteners 126 and 128 may be threaded with or into a particular component opposite another component that the first and second fasteners 122 and 124 are threaded with or into. For example, in the implementation illustrated in FIG. 4, the first and second fasteners 122 and 124 are threaded with the first component 112 and the third and fourth fasteners 126 and 128 are threaded with the second component 114.

The thermally conductive interface assembly 102 includes one or more heating elements configured to generate heat and provide the heat to one or more shape memory alloy components of the thermally conductive interface assembly 102. Each heating element of the one or more heating elements is coupled to one or more fasteners of the thermally conductive interface assembly 102. In the implementation illustrated in FIG. 4, the thermally conductive interface assembly 102 includes a first heating element 482 coupled to the first fastener 122 and a second heating element 484 coupled to the second fastener 124. In other implementations, a particular heating element is coupled to or integral with one or more shape memory components indirectly. For example, a heating element may be coupled to a fastener connector, such as the fastener connector 262 of FIG. 2. In a particular implementation, the one or more heating elements include or correspond to a resistive type heating element.

The thermally conductive interface assembly 102 further includes a controller 408 coupled (e.g., communicatively coupled) to the one or more heating elements and configured to control operations of the one or more heating elements. The controller 408 includes a processor and memory storing instructions executable by the processor. The controller 408 is configured to send control signals to the one or more heating elements (or a power supply thereof). The controls signal may activate the one or more heating elements or may cause a modification of a voltage or a current received by the one or more heating elements. Alternatively, the controller 408 includes the power supply and the controller 408 is configured to supply a power signal to the one or more heating elements and to adjust the power signal.

During operation, the controller 408 activates (or adjusts an amount of heat generated by) the heating elements 482 and 484 responsive to a manual input, a sensor input, or a combination thereof. For example, the controller 408 may activate the heating elements 482 and 484 responsive to a user input. As other examples, the controller 408 may activate the heating elements 482 and 484 responsive to input from a temperature sensor, a positioning sensor, or a timer. The activation of the heating elements 482 and 484 may correspond to the second time (e.g., a radiator coupled to the thermally conductive interface assembly 102 experiences low environmental loading), as described with reference to FIG. 1.

The heating elements 482 and 484 generate heat and cause the first fastener 122 and the second fastener 124 to reach a first temperature 492. Responsive to reaching the first temperature 492, the first fastener 122 and the second fastener 124 reconfigure (or transform) into a compressed shape or a twisted shape. For example, a length or volume of the fasteners 122 and 124 may decrease and/or the fasteners 122 and 124 may twist causing threads of the fastener 122 and 124 to bias the thermally conductive interface assembly 102 towards the second state 190 (e.g., pull the components together). For example, the first fastener 122 includes threads that are threaded into or with threads of the second component 114 to generate the force to pull the first component 112 and the second component 114 together.

At a time (e.g., when a radiator coupled to the thermally conductive interface assembly 102 experiences high environmental loading) subsequent to activation of the heating elements 482 and 484, the controller 408 deactivates or adjusts the heat generated by the heating elements 482 and 484 responsive to a manual input, a sensor input, or a combination thereof. The heating elements 482 and 484 cease generating heat (or generate less heat) and cause the first fastener 122 and the second fastener 124 to reach a second temperature 494. Responsive to reaching the second temperature 494, the first fastener 122 and the second fastener 124 reconfigure (or transform) into an original shape, an expanded shape, or an untwisted shape. For example, a length or volume of the fasteners 122 and 124 may increase and/or the fasteners 122 and 124 may untwist causing threads of the fastener to bias the thermally conductive interface assembly 102 towards the first state 180 (e.g., push the components apart). To illustrate, the threads of the first fastener 122 generate a force to push the first component 112 and the second component 114 apart.

In other implementations, the thermally conductive interface assembly 102 includes shape memory alloy bolts, washers, or nuts in addition, or in the alternative to the shape memory alloy screws (e.g., the first and second fasteners 122 and 124). In such implementations, the shape memory alloy bolts, washers, or nuts are configured to have an expanded or untwisted shape responsive to the first temperature 492. The expanded or untwisted shape generates a force to bias the thermally conductive interface assembly 102 towards the first state 180.

Referring to FIG. 5, an example of a diagram 500 that includes a first representation of the thermally conductive interface assembly 102 in the first state 180 and a second representation of the thermally conductive interface assembly 102 in the second state 190 is illustrated. In the implementation illustrated in FIG. 5, each of the first fastener 122 and the second fastener 124 corresponds to a shape memory alloy screw. Threads of the first and second fasteners 122 and 124 may be threaded with or into the first component 112 or the second component 114. For example, in the implementation illustrated in FIG. 5, the first and second fasteners 122 and 124 are threaded with the second component 114.

The thermally conductive interface assembly 102 includes one or more heating elements, such as the first heating element 482 and the second heating element 484, as described with reference to FIG. 4. The thermally conductive interface assembly 102 further includes one or more spacers, such as the spacer 264, as described with reference to FIG. 2

The operation of the implementation illustrated in FIG. 5 is the reverse of the operation illustrated in FIG. 4. Thus, heating a shape memory alloy component of the thermally conductive interface assembly 102 generates a force to bias the thermally conductive interface assembly 102 towards the second state 190. In FIG. 5, the first and second fasteners 122 and 124 include shape memory alloy material and generate the force to bias the thermally conductive interface assembly 102 towards the second state 190. In the particular implementation illustrated in FIG. 5, the first and second fasteners 122 and 124 correspond to shape memory alloy screws. The first and second fasteners 122 and 124 reconfigure to a compressed shape or a twisted shape responsive to reaching the first temperature 492. The heat provided by the heating elements 482 and 484 causes the first and second fasteners 122 and 124 to reach the first temperature 492. The first and second fasteners 122 and 124 reconfigure to an original shape, an expanded shape or an untwisted shape responsive to reaching the second temperature 494 and cease generating the force to bias the bias the thermally conductive interface assembly 102 towards the second state 190.

In addition, the thermally conductive interface assembly 102 of FIGS. 4 and 5 may include feedback control. For example, the controller 408 may receive data from a sensor and adjust the heat generated by one or more heating elements. To illustrate, the controller 408 may receive temperature data, interface separation data, or both, and determine to adjust the heat generated by one or more heating elements (e.g., the first heating element 482, the second heating element 484, or both). In such implementations, the thermally conductive interface assembly 102 may include more than two states, such as third state where a second gap is smaller or larger than the gap 160.

By using heating element to control the thermally conductive interface assembly manual control and more precise control over heat rejection from a vehicle is possible as compared to passive systems. Additionally, the thermally conductive interface assembly can use a shape memory alloy component to generate a force to bias the thermally conductive interface assembly towards the second state 190 (e.g., closed). Further, using heating elements to control the thermally conductive interface assembly may require less precision in the design process and enable the vehicle to operate in a wider range of temperatures and environments.

Figure 6:
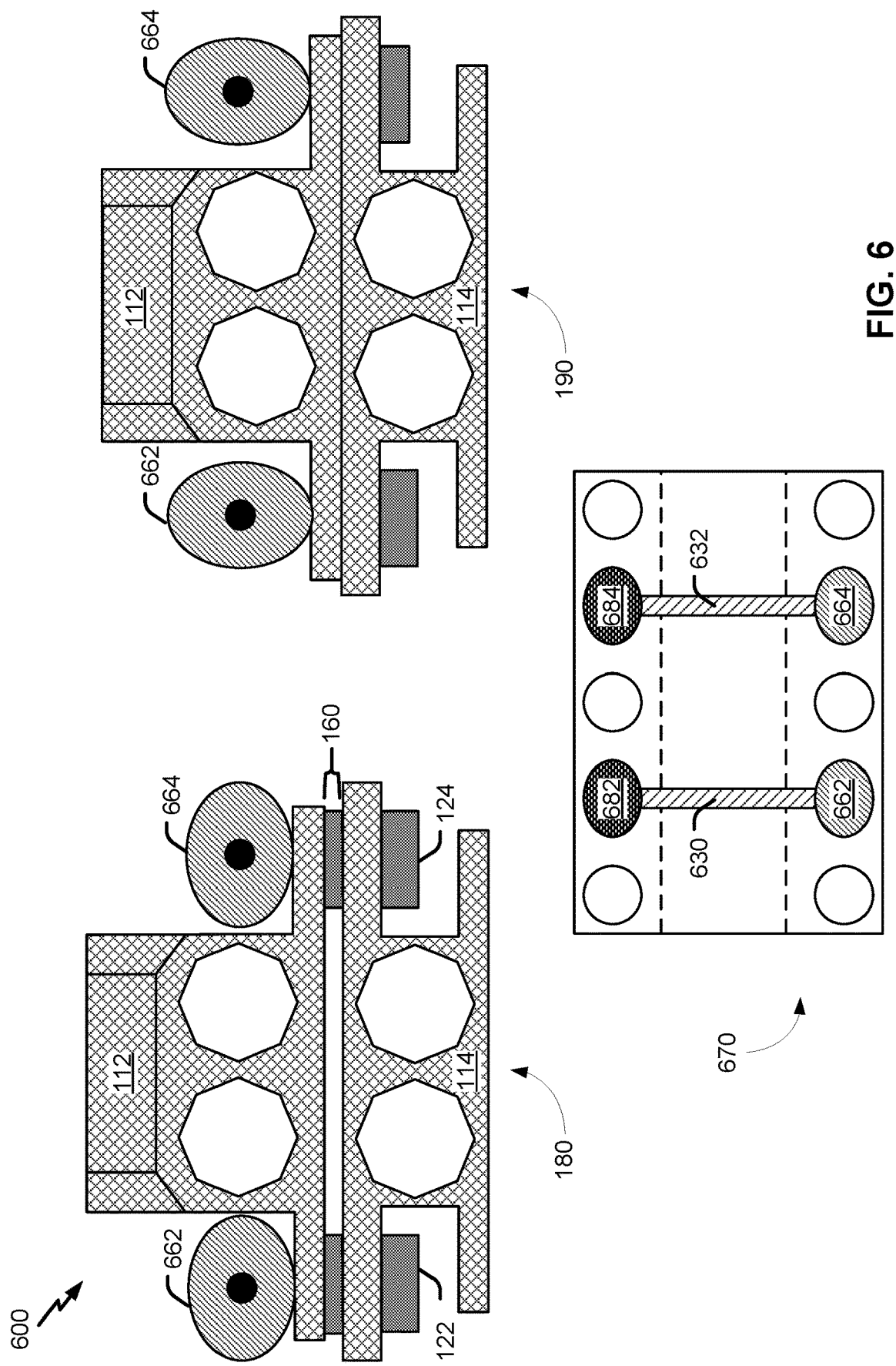
FIG. 6 is a diagram that illustrates an example of a thermally conductive interface assembly that includes mechanical linkage.

FIG. 6 is diagram 600 that illustrates an example of a thermally conductive interface assembly that includes mechanical linkage. In FIG. 6, the diagram 600 illustrates the thermally conductive interface assembly 102 movable between the first state 180 and the second state 190 by a cam and a camshaft. The camshaft includes shape memory alloy material and is configured to rotate the cam to bias the thermally conductive interface assembly 102 towards the first state 180 or the second state 190.

The diagram 600 includes a first representation of the thermally conductive interface assembly 102 in the first state 180 and a second representation of the thermally conductive interface assembly 102 in the second state 190. The thermally conductive interface assembly 102 further includes one or more cams and one or more camshafts configured to generate a force to bias the thermally conductive interface assembly 102 towards the first state 180. In the implementation illustrated in FIG. 6, a first cam 662 corresponds to the first fastener 122 and a second cam 664 corresponds to the second fastener 124. For example, the first cam 662 is aligned with the first fastener 122. The first cam 662 and the second cam 664 exert forces on the first component 112 to move the first component 112 towards the second component 114.

In FIG. 6, the diagram 600 also illustrates a top view 670 of the thermally conductive interface assembly 102. The top view 670 depicts a first shape memory alloy camshaft 630 coupled to a first fixed end 682 and to the first cam 662 and a second shape memory alloy camshaft 632 coupled to a second fixed end 684 and to the second cam 664.

During operation, at the first time, the shape memory alloy camshafts 630 and 632 (e.g., shape memory alloy components) of the thermally conductive interface assembly 102 reaches the first temperature responsive to receiving (directly or indirectly) thermal energy from the Sun. Responsive to reaching the first temperature, the shape memory alloy components generate a force to rotate the cams 662 and 664 to a first orientation. Rotation of the cams 662 and 664 to the first orientation (e.g., a major axis of the cams 662 and 664 parallel to interface surfaces, such as the interface surfaces 152 and 154 of FIG. 1, of the first and second components 112 and 114) biases the thermally conductive interface assembly 102 towards the first state 180. The force generated by the shape memory alloy camshafts 630 and 632 overcomes a force generated by the first and second fasteners 122 and 124 that biases the thermally conductive interface assembly 102 towards the second state 190.

At the second time, the shape memory alloy camshafts 630 and 632 of the thermally conductive interface assembly 102 reaches the second temperature responsive to receiving (directly or indirectly) relatively less environmental loading. Responsive to reaching the second temperature, the shape memory alloy camshafts 630 and 632 generate a force to rotate the cams 662 and 664 to a second orientation. Rotation of the cams 662 and 664 to the second orientation (e.g., a major axis of the cams 662 and 664 perpendicular to the interface surfaces) biases the thermally conductive interface assembly 102 towards the first state 180. Responsive to the shape memory alloy camshafts 630 and 632 ceasing to generate the force to bias the thermally conductive interface assembly 102 towards the first state 180, the force generated by the first and second fasteners 122 and 124 biases the thermally conductive interface assembly 102 towards the second state 190.

In other implementations, a shape memory alloy component reconfigures to generate a force to bias the thermally conductive interface assembly 102 towards the second state 190 (close the thermal interface and eliminate the gap 160). In such implementations, the shape memory alloy component reconfigures to a compressed state, a twisted state, or an untwisted state. Additionally, the thermally conductive interface assembly 102 includes other components, such as a heating element, a controller, one or more fastener connectors (e.g., heat spreaders), as described with reference to FIGS. 1-5.

Additionally or alternatively, one or more of the shape memory alloy camshafts 630 and 632 may be activated or controlled by a controller and heating element, as described with reference to FIGS. 4 and 5. In such implementations, the thermally conductive interface assembly 102 is configured such that rotation of the shape memory alloy camshafts 630 and 632 biases the thermally conductive interface assembly 102 towards the first state 180 or the second state 190. In addition, the thermally conductive interface assembly 102 may include one more spacers, such as spacers 264 and 364 as described with reference to FIGS. 2-5. Further, the thermally conductive interface assembly 102 may include the thermal interface material 136 of FIGS. 1-5.

By using the cams and the shape memory alloy camshafts a mechanical advantage may be obtained which increases a force generated by shape memory alloy components used to bias the thermally conductive interface assembly 102. Additionally, as the cams have a fixed displacement, the cams and the shape memory alloy camshafts may allow for a more precise control of the gap 160 and a more precise control of the conductive heat transfer characteristics of the thermally conductive interface assembly 102 as compared to the implementations illustrated in FIGS. 2-5.

Figure 7:
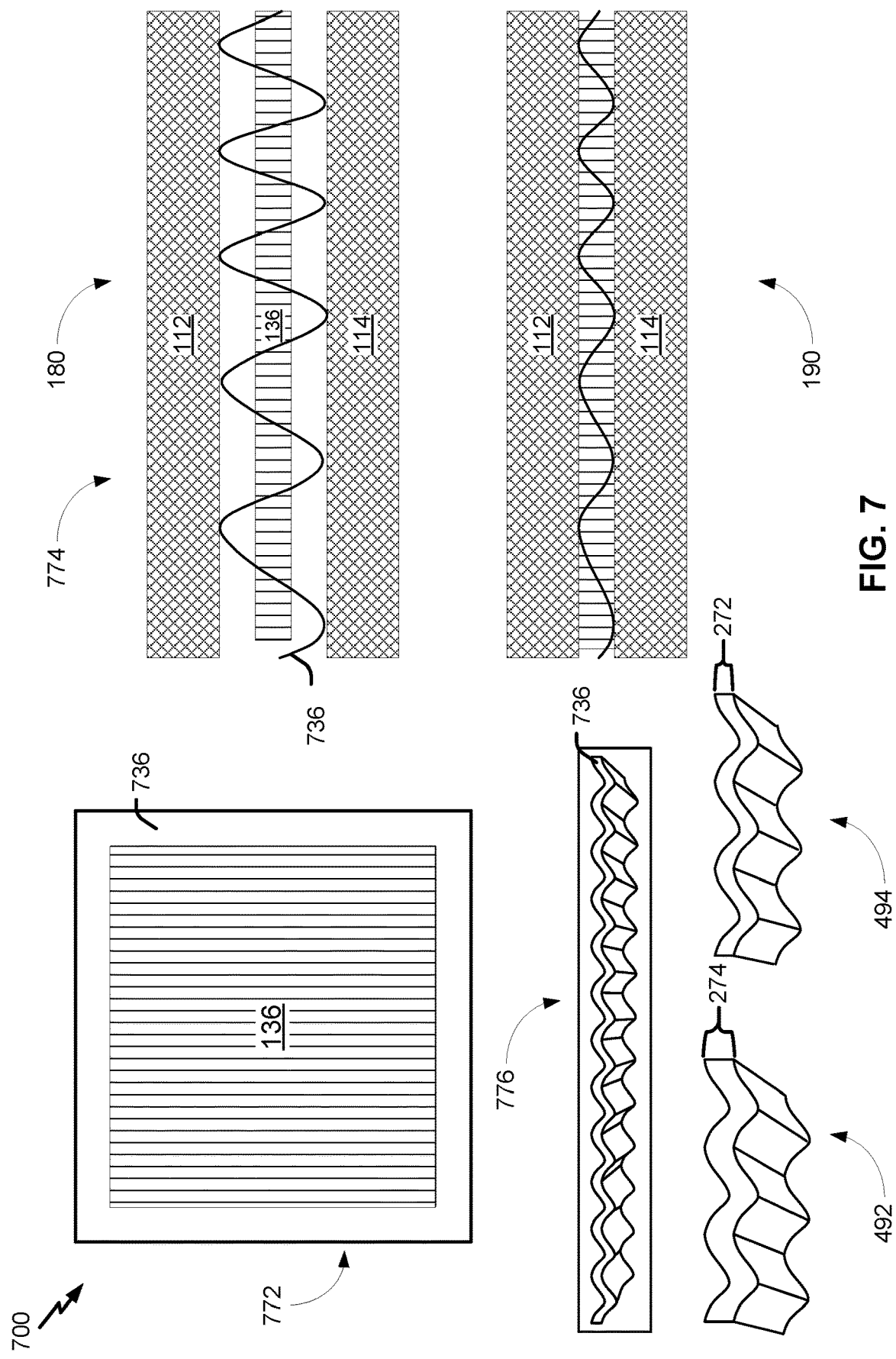
FIG. 7 is a diagram that illustrates an example of a shape memory alloy frame of a thermal interface material.
Figure 8:
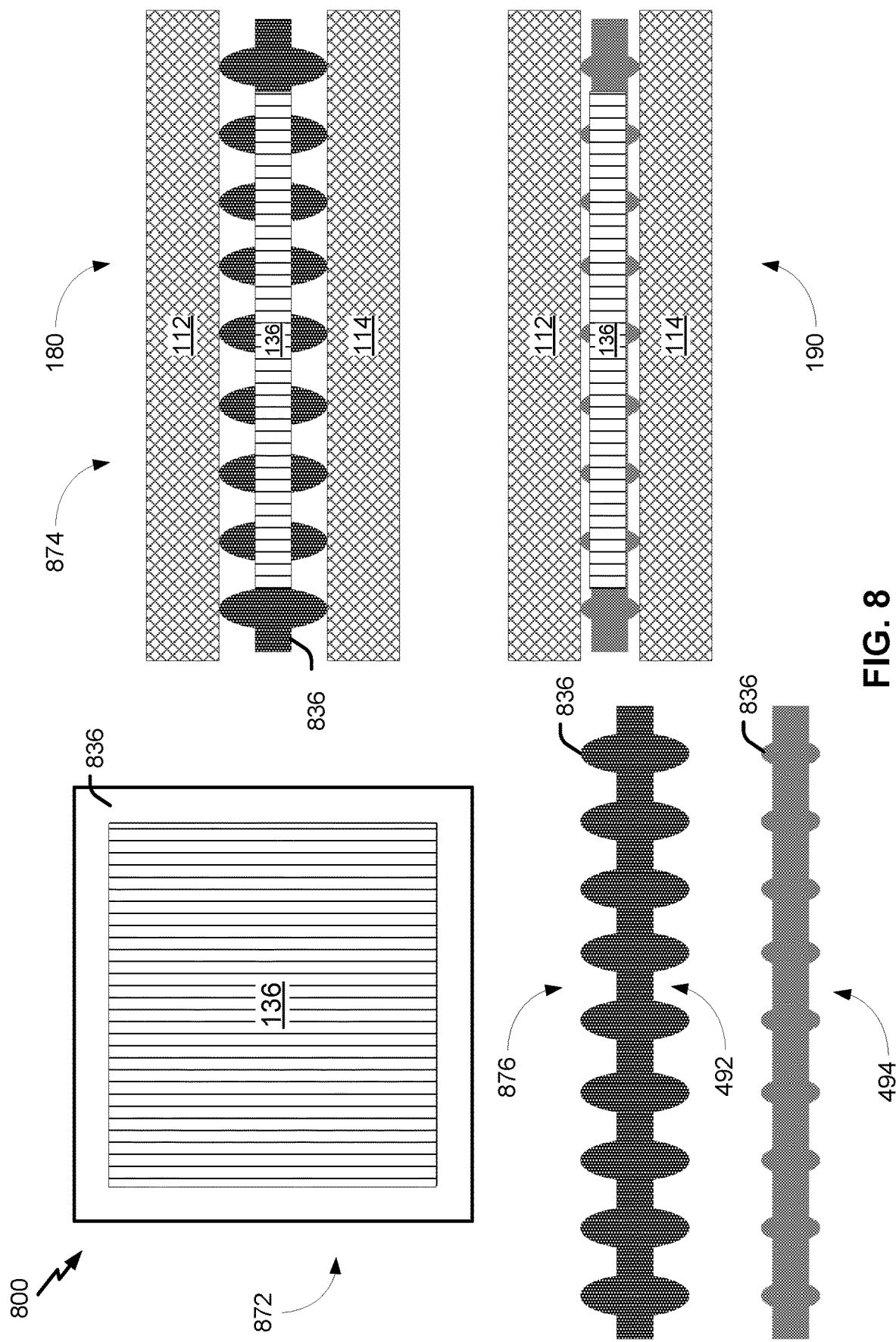
FIG. 8 is a diagram that illustrates another example of a shape memory alloy frame of a thermal interface material.

In addition to, or in the alternative to, using shape memory alloy fasteners, as described with reference to FIGS. 1-5, or using shape memory alloy camshafts, as described with reference to FIG. 6, a thermally conductive interface assembly may include a shape memory alloy component positioned in the thermal interface (e.g., positioned between the first component 112 and the second component 114). As described further with reference to FIGS. 7 and 8, the shape memory alloy component is a frame which partially surrounds a thermal interface material, such as the thermal interface material 136 of FIG. 1. As illustrated in FIGS. 7 and 8, the shape memory alloy frame is configured to expand responsive to an increase in temperature to open the thermal interface of the thermally conductive interface assembly. The first component 112 and the second component 114 are in contact via the shape memory alloy frame and the thermal interface material in the open state.

FIGS. 7 and 8 illustrate exemplary implementations of a thermal interface material, such as the thermal interface material 136 of FIG. 1, that includes a shape memory alloy frame. FIG. 7 illustrates a "corrugated" shape memory alloy frame 736 and FIG. 8 illustrates a "dimpled" shape memory alloy frame 836. A shape memory alloy frame may be made of a shape memory alloy or of a non-shape memory metal (or alloy) which includes shape memory alloy features or elements (e.g., tubing, threads, caps, pins, posts, or notches). The exemplary thermal interface materials of FIGS. 7 and 8 may include or correspond to the thermal interface material 136 of FIGS. 1-6.

Referring to FIG. 7, a diagram 700 illustrates a top view 772 and side views 774 and 776 of the thermal interface material 136 that includes the corrugated shape memory alloy frame 736. For example, in some implementations the corrugated shape memory alloy frame 736 is formed or worked into a corrugated shape (wavy, uneven, ribbed grooved, etc.). As the corrugated shape memory alloy frame 736 experience a temperature change (e.g., heated or cooled) the corrugated shape memory alloy frame 736 changes shape and exterior surfaces (e.g., surfaces further from a center of the corrugated shape memory alloy frame 736) move outwards from the center of the corrugated shape memory alloy frame 736 to open a thermal interface of the thermally conductive interface assembly.

Referring to the top view 772, the thermal interface material 136 is surrounded by the corrugated shape memory alloy frame 736. Referring to a first side view 774, representations of the corrugated shape memory alloy frame 736 are illustrated when the thermally conductive interface assembly 102 is in the first state 180 and the second state 190. The first state 180 corresponds to the corrugated shape memory alloy frame 736 being at or above the first temperature 492 and the second state 190 corresponds to the corrugated shape memory alloy frame 736 being at or below the second temperature 494.

Referring to a second side view 776, three-dimensional representations of the corrugated shape memory alloy frame 736 are illustrated, including a first representation of a portion of the corrugated shape memory alloy frame 736 at the first temperature 492 and a second representation of the portion of the corrugated shape memory alloy frame 736 at the second temperature 494. As illustrated in FIG. 7, the portion of the corrugated shape memory alloy frame 736 has the first size 272 (e.g., a vertical dimension as illustrated in FIG. 7) at the first temperature 492 and has the second size 274 at the second temperature 494. The first size 272 corresponds to the first state 180 of the thermally conductive interface assembly 102. As illustrated in FIG. 2, the first size 272 is smaller than the second size 274.

Referring to FIG. 8, a diagram 800 illustrates the "dimpled" thermal interface material includes shape memory alloy or shape memory alloy features. For example, in some implementations the dimpled thermal interface includes a thermally conductive base (e.g., copper) with shape memory alloy material deposited on the thermally conductive base to form dots or dimples. As the dots or dimples experience a temperature change (e.g., heated or cooled), the dots or dimples change shape and expand outwards from the thermally conductive base to open a thermal interface of a thermally conductive interface assembly 102. Additionally, the thermal interface materials may be coupled to or include a heating element to control the thermal interface as described with reference to FIGS. 4 and 5.

Referring to the top view 872, the thermal interface material 136 is surrounded by the dimpled shape memory alloy frame 836. Referring to a first side view 874, representations of the dimpled shape memory alloy frame 836 are illustrated when the thermally conductive interface assembly 102 is in the first state 180 and the second state 190 is illustrated. The first state 180 corresponds to the dimpled shape memory alloy frame 836 being at or above the first temperature 492 and the second state 190 corresponds to the dimpled shape memory alloy frame 836 being at or below the second temperature 494.

Referring to a second side view 876, three-dimensional representations of the dimpled shape memory alloy frame 836 are illustrated, including a first representation of the dimpled shape memory alloy frame 836 at the first temperature 492 and a second representation of the dimpled shape memory alloy frame 836 at the second temperature 494. As illustrated in FIG. 8, the corrugated shape memory alloy frame 836 has larger "dimples" at the first temperature 492 than at the second temperature 494.

By using thermal interface materials that include a shape memory alloy frame or a frame with shape memory alloy features, an existing thermal interface may be retrofit to include passive or active control over heat rejected (or absorbed) by the thermal interface. The thermal interface material and shape memory alloy frame may provide a greater force and a more even force distribution on the thermal interface than shape memory fasteners alone. As compared to a thermally conductive interface assembly which includes a thermal interface material only, a thermally conductive interface assembly which includes a thermal interface material and shape memory alloy frame may have a lower thermal conductivity.

Two or more of the foregoing implementations of FIGS. 1-8 may be combined. For example, a thermally conductive interface assembly may utilize passive activation and active heating. To illustrate, a first subset of fasteners of a thermally conductive interface assembly may be passively heated to bias the thermally conductive interface assembly towards an open state and a second subset of fasteners may be actively heated by a heating element(s) to bias the thermally conductive interface assembly towards the open state or towards a closed state. As another example, a thermally conductive interface assembly may include different types of shape memory alloy components. To illustrate, a thermally conductive interface assembly may include the shape memory alloy washers of FIGS. 1 and 2 and the shape memory alloy screws of FIGS. 4 and 5. As another illustration, a thermally conductive interface assembly may include a shape memory alloy frame as in FIGS. 7 and 8 and a shape memory fastener as in FIGS. 1-5 or a shape memory alloy camshaft as in FIG. 6. The shape memory alloy components may have different programmed shapes for a given temperature (or range of temperature) thus allowing different size gaps to be formed at multiple temperatures (e.g., allowing more than two states).

Figure 9:
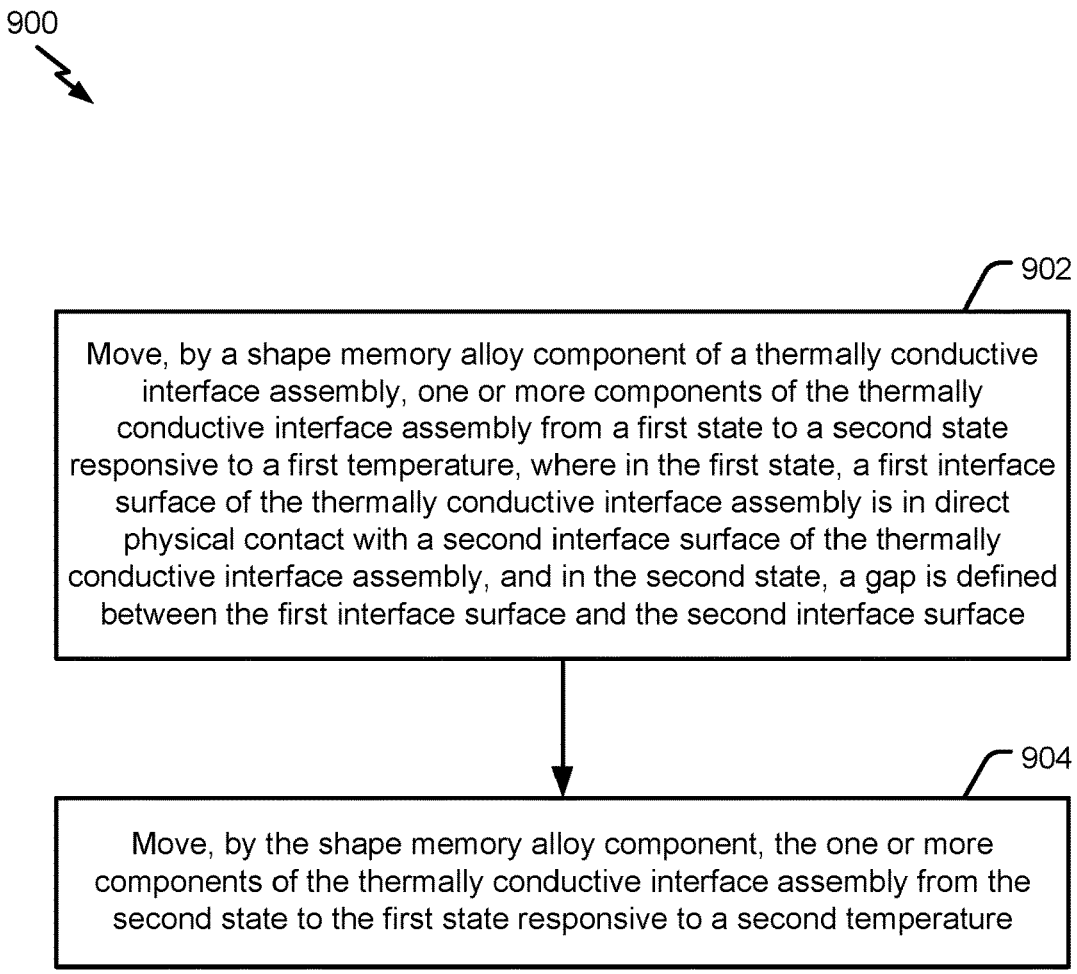
FIG. 9 is a flow chart of an example of a method for transferring heat using a thermally conductive interface assembly.

FIG. 9 illustrates a method 900 of operating a thermally conductive interface assembly. The method 900 may be performed by the thermally conductive interface assembly 102 of FIGS. 1-8, the fasteners 122-132 of FIGS. 1-8, the spacers 264 and 364 of FIGS. 2-5, the controller 408 of FIG. 4, or a combination thereof. The method 900 includes, at 902, moving, by a shape memory alloy component of a thermally conductive interface assembly, one or more components of the thermally conductive interface assembly from a first state to a second state (or vice-versa) responsive to a first temperature. In the first state, a first interface surface of the thermally conductive interface assembly is in contact (e.g., direct physical contact or thermal contact via a thermal interface material) with a second interface surface of the thermally conductive interface assembly, and in the second state, a gap is defined between the first interface surface and the second interface surface. The thermally conductive interface assembly has first conductive heat transfer characteristics in the first state and has second conductive heat transfer characteristics in the second state.

The shape memory alloy component may include or correspond to one or more fasteners of the fasteners 122-132 of FIGS. 1-8, the thermal interface material 136 of FIGS. 1-5, 7 and 8, the shape memory alloy camshafts 630 and 632 of FIG. 6, the shape memory alloy frame 736 of FIG. 7, the shape memory alloy frame 836 of FIG. 8, or a combination thereof. The thermally conductive interface assembly may include or correspond to the thermally conductive interface assembly 102 of FIGS. 1-8. The one or more components may include or correspond to the first and second components 112 and 114 of FIGS. 1-8, the fasteners 122-132 of FIGS. 1-8, the thermal interface material 136 of FIGS. 1-5, 7 and 8, the heat pipes 142 and 144 of FIGS. 1 and 2, the spacers 264 and 364 of FIGS. 2-5, the cams 662 and 664 of FIG. 6, or a combination thereof. The first state may include or correspond to the second state 190 of FIGS. 1-8 and the second state may include or correspond the first state 180 of FIGS. 1-8. The first interface surface and the second interface surface may include or correspond to the first interface surface 152, the second interface surface 154, a surface of the first component 112, a surface of the second component 114, a surface of the thermal interface material 136, a surface of the spacer 264, a surface of the shape memory alloy frame 736 of FIG. 7, a surface of the shape memory alloy frame 836 of FIG. 8, or a combination thereof.

The method 900 of FIG. 9 further includes, at 904, moving, by the shape memory alloy component, the one or more components of the thermally conductive interface assembly from the second state to the first state responsive to a second temperature. The first temperature may include or correspond to the first temperature of FIGS. 1-8 and the second temperature may include or correspond the second temperature of FIGS. 1-8. In some implementations, the first temperature is greater than the second temperature, and in other implementations, the first temperature is less than the second temperature.

In some implementations, the thermally conductive interface assembly is included in a vehicle and is configured to selectively reject heat from the vehicle (and/or electronic devices thereof) via a radiator, such as the radiator 106, as described with reference to FIG. 1. In a particular implementation, the thermally conductive interface assembly is located in a close-out panel of a spacecraft.

In some implementations, the thermally conductive interface assembly includes a thermal interface material positioned between the first component and the second component, and wherein the first interface surface corresponds to a surface of the thermal interface material. In some implementations, the second interface surface corresponds to a surface of the first component 112, a surface of the second component 114, a surface of the spacer 264, or a surface of another thermal interface material.

In some implementations, the thermally conductive interface assembly includes a thermal interface material positioned between the first interface surface and the second interface surface, and the first interface surface is in thermal contact with the second interface surface via the thermal interface material in the first state. For example, as described with reference to FIG. 1, the first interface surface 152 is in contact with the second interface surface 154 via the thermal interface material 136 and conductively transfers the heat generated by the electronic device 104 in the second state 190.

In some implementations, in the first state, the thermally conductive interface assembly is configured to conductively transfer the heat generated by the electronic device from the first interface surface to the second interface surface. In the second state, the thermally conductive interface assembly is configured to prevent conductive heat transfer between the first interface surface and the second interface surface. As described with reference to FIG. 1, in the second state 190, the first interface surface 152 is in contact with the second interface surface 154 via the thermal interface material 136 and conductively transfers the heat generated by the electronic device 104. In the first state 180, the first interface surface 152 is not in contact with the second interface surface 154 via the thermal interface material 136 and does not conductively transfer the heat generated by the electronic device 104. In the first state, the first interface surface 152 is separated from the second interface surface 154 by an insulator, such as the gap 160. In other implementations, the first and second state have the opposite effect.

The method 900 may further include receiving heat from an external source, where the received heat causes a temperature change from the first temperature to the second temperature or from the second temperature to the first temperature. For example, the thermally conductive interface assembly may receive solar radiation from the Sun and the solar radiation may cause a temperature change between the first and second temperatures, as described with reference to FIG. 1

In a particular implementation, responsive to receiving heat from the external source, the shape memory alloy component transitions from a compressed shape to an expanded shape. The transition from the compressed shape to the expanded shape moves the one or more components of the thermally conductive interface assembly from the first state to the second state or from the second state to the first state. Alternatively, the shape memory alloy component transitions from a twisted state to an untwisted state. The transition from the twisted shape to the untwisted shape moves the one or more components of the thermally conductive interface assembly from the first state to the second state or from the second state to the first state.

The method 900 may further include providing heat, from a heating element, to the shape memory alloy component to transition the shape memory alloy component from a compressed shape to an expanded shape, where the heat causes a temperature change from the first temperature to the second temperature or from the second temperature to the first temperature. For example, the heating elements 482 and 484 generate and provide heat to the shape memory alloy components (e.g., the fasteners 130 and 132), as described with reference to FIGS. 4 and 5. In other implementations, the heat provided by the heating element transitions the shape memory alloy component from the expanded or untwisted shape to the compressed or twisted shape.

Figure 10:
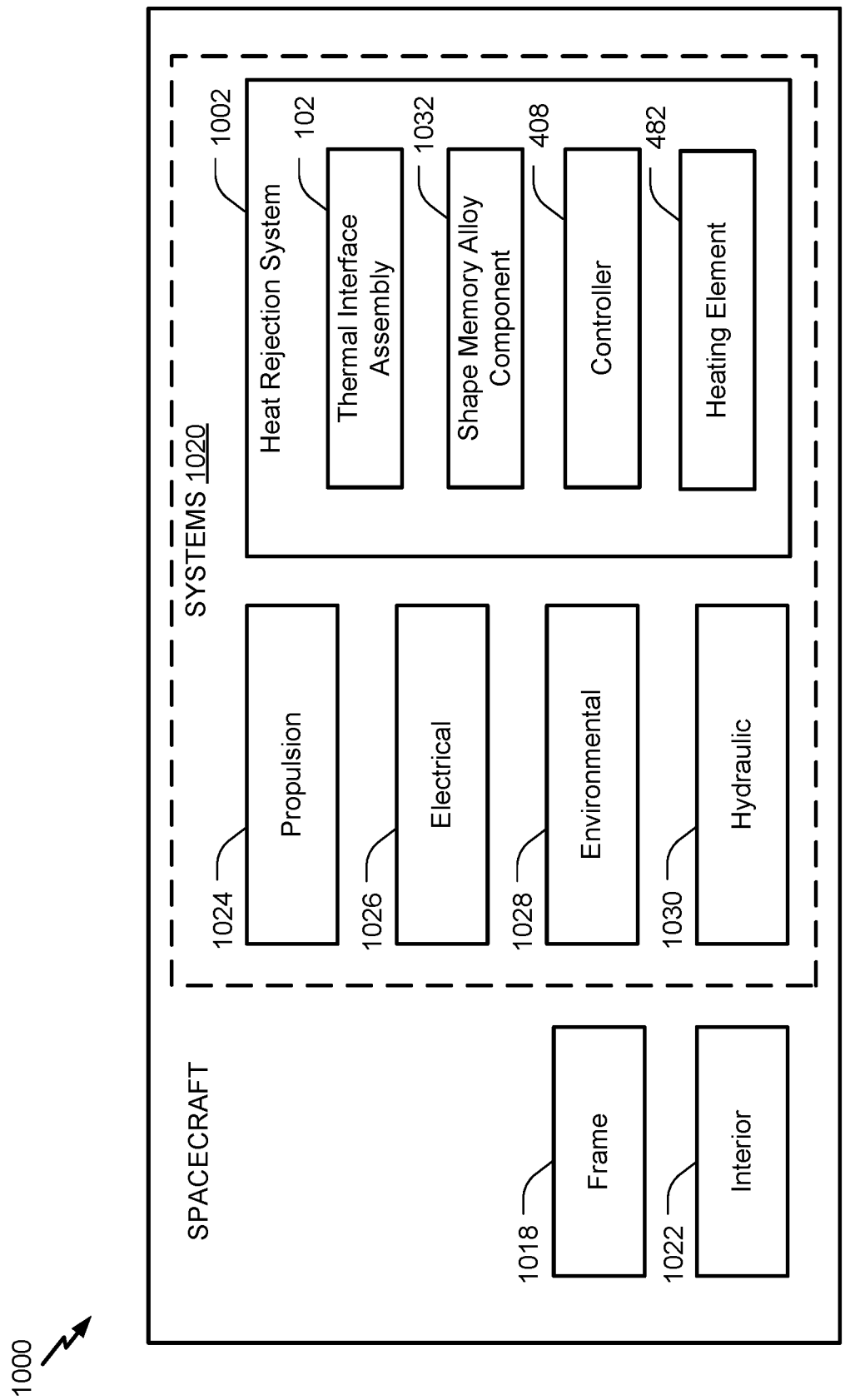
FIG. 10 is a block diagram that illustrates an example of a spacecraft.

Referring to FIG. 10, a block diagram of an illustrative embodiment of a spacecraft 1000 (e.g., a manned or unmanned spacecraft). As shown in FIG. 10, the spacecraft 1000 (e.g., a spaceship, a satellite, or a space station) includes a frame 1018, an interior 1022, and a plurality of systems 1020. The systems 1020 may include one or more of a propulsion system 1024, an electrical system 1026, a hydraulic system 1030, an environmental system 1028, and a heat rejection system 1002. Alternatively, the heat rejection system 1002 may be part of the environmental system. Any number of other systems may be included in the spacecraft 1000.

The heat rejection system 1002 includes the thermally conductive interface assembly 102 of FIGS. 1-8 and a shape memory alloy component 1032. The shape memory alloy component 1032 may include or correspond to one or more fasteners of the fasteners 122-132 of FIGS. 1-8, the thermal interface material 136 of FIGS. 1-5, 7 and 8, the spacers 264 and 364 of FIGS. 2-5, the shape memory alloy camshafts 630 and 632 of FIG. 6, the shape memory alloy frame 736 of FIG. 7, the shape memory alloy frame 836 of FIG. 8, or a combination thereof. In the particular implementation illustrated in FIG. 10, the heat rejection system 1002 include the controller 408 and the first heating element 482. The thermally conductive interface assembly 102 may be included in or coupled to an exterior surface of the spacecraft 1000. For example, the thermally conductive interface assembly 102 may be include in a close-out panel of the spacecraft 1000. The heat rejection system 1002 is configured to reject heat from the spacecraft 1000 (or electronics thereof) as described above with reference to FIGS. 1-9. For example, the controller 408 may be configured to execute computer-executable instructions (e.g., a program of one or more instructions) stored in a memory. The instructions, when executed, cause the controller 408 to perform one or more operations of the method 900. For example, the controller 408 may send control signals to the first heating element 482 to activate the first heating element 482 to open the thermal interface and to deactivate the first heating element 482 to close the thermal interface, as described with reference to FIGS. 4 and 5. Alternatively, the heat rejection system 1002 is passive and the shape memory alloy component 1032 opens and closes the thermal interface dependent on external loading (and independent of a controller 408).

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method operations may be performed in a different order than shown in the figures or one or more method operations may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

What is claimed is:

1. An apparatus comprising:
an electronic device; and
an interface assembly comprising:
a first component associated with a first interface surface, the electronic device thermally coupled to the first component;
a second component associated with a second interface surface;
a shape memory alloy component coupled to the first component and the second component, the shape memory alloy component configured to, in response to a temperature of the shape memory alloy component reaching a particular temperature, transition between an expanded state and a compressed state, wherein in response to the transition, the first component moves relative to the second component between a first state and a second state, wherein, in the first state, the first interface surface is in contact with the second interface surface to thermally couple the electronic device to the second component, and wherein, in the second state, a gap is formed between the first interface surface and the second interface surface to inhibit thermal coupling of the electronic device to the second component;
one or more heating elements coupled to the shape memory alloy component, the one or more heating elements distinct from the first component and the second component; and
a controller coupled to the one or more heating elements, the controller configured to cause, based on a condition, the one or more heating elements to heat the shape memory alloy component to reach at least the particular temperature.

2. The apparatus of claim 1, wherein the one or more heating elements are embedded in one or more fasteners that are coupled to the first component and the second component.

3. The apparatus of claim 2, wherein heat provided by the one or more heating elements to the shape memory alloy component causes transition to the first state to contact the first interface surface with the second interface surface.

4. The apparatus of claim 2, wherein heat provided by the one or more heating elements to the shape memory alloy component causes transition to the second state to form the gap between the first interface surface and the second interface surface.

5. The apparatus of claim 2, wherein the condition is user input to activate the one or more heating elements.

6. The apparatus of claim 2, wherein the condition is passage of a particular amount of time.

7. The apparatus of claim 2, wherein the condition is based on sensor data received by the controller.

8. The apparatus of claim 1, wherein the gap inhibits transfer of heat received at the second component to the electronic device.

9. The apparatus of claim 1, wherein the contact of the first interface surface with the second interface surface facilitates transfer of heat away from the electronic device to the second component.

10. The apparatus of claim 1, wherein the second component is thermally coupled to a radiator.

11. A spacecraft comprising:
a close-out panel comprising a first side corresponding to an interior portion of the spacecraft and a second side corresponding to an exterior portion of the spacecraft;
an interface assembly located in the close-out panel, the interface assembly comprising:
a first component associated with a first interface surface, the first component thermally coupled to the first side of the close-out panel;
a second component associated with a second interface surface, the second component thermally coupled to the second side of the close-out panel; and
a shape memory alloy component coupled to the first component and the second component, the shape memory alloy component configured to, in response to a temperature of the shape memory alloy component reaching a particular temperature, transition between an expanded state and a compressed state, wherein in response to the transition, the first component moves relative to the second component between a first state and a second state, wherein, in the first state, the first interface surface is in contact with the second interface surface to facilitate heat transfer between the first side of the close-out panel and the second side of the close-out panel, and wherein, in the second state, a gap is formed between the first interface surface and the second interface surface to inhibit heat transfer between first side of the close-out panel and the second side of the close-out panel.

12. The spacecraft of claim 11, further comprising one or more heaters coupled to the shape memory alloy component and a controller, wherein the transition from the first state to the second state is controlled by application of heat, or by a lack of application of heat, from the one or more heaters to the shape memory alloy component responsive to a command from the controller, and wherein the one or more heaters are distinct from the first component and the second component.

13. The spacecraft of claim 11, wherein the shape memory alloy component is in the second state in response to the exterior portion receiving solar radiation from the sun.

14. The spacecraft of claim 11, wherein heat transfer between the second component and the second side occurs by radiative heat transfer.

15. The spacecraft of claim 11, further comprising a heat pipe coupled to the second component.

16. A method comprising:
    facilitating heat transfer between an interior side of a close-out panel and an exterior side of the close-out panel via an interface assembly located in the close-out panel in response to the interface assembly being in a first state, wherein in the first state, a first surface of a first component of the interface assembly contacts a second surface of a second component of the interface assembly, the interface assembly comprising:
        the first component, the first component thermally coupled to the interior side, the second component, the second component thermally coupled to the exterior side; and
        a shape memory alloy component coupled to the first component and the second component, the shape memory alloy component configured to, in response to a temperature of the shape memory alloy component reaching a particular temperature, transition between an expanded state and a compressed state, wherein in response to the transition, the first component moves relative to the second component between the first state and a second state, wherein, in the first state, the first surface contacts the second surface, and wherein, in the second state, a gap is formed between the first surface and the second surface; and
    transferring heat to or from the shape memory alloy component to transition from the first state to the second state to form the gap and inhibit heat transfer between the interior side and the exterior side via the interface assembly.

17. The method of claim 16, wherein transferring heat to the shape memory alloy component comprises heating the shape memory alloy component with at least one heating element to at least the particular temperature.

18. The method of claim 16, wherein the shape memory alloy component is configured to transition to the second state in response to exposure of the exterior side to solar radiation from the sun.

19. The method of claim 16, wherein the shape memory alloy component changes to a compressed shape from an expanded shape responsive to the temperature of the shape memory alloy component reaching the particular temperature.

20. The method of claim 19, wherein the shape memory alloy component returns to the expanded shape responsive to the temperature increasing to a second particular temperature different than the particular temperature.

* * * * *